(12) United States Patent
Miura

(10) Patent No.: US 12,712,331 B2
(45) Date of Patent: Aug. 18, 2026

(54) LIGHT EMITTING DEVICE

(71) Applicant: Nichia Corporation, Anan (JP)

(72) Inventor: Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 941 days.

(21) Appl. No.: 17/701,312

(22) Filed: Mar. 22, 2022

(65) Prior Publication Data

US 2022/0216668 A1 Jul. 7, 2022

Related U.S. Application Data

(63) Continuation of application No. 17/512,212, filed on Oct. 27, 2021, which is a continuation of application
(Continued)

(30) Foreign Application Priority Data

Aug. 16, 2017 (JP) ................................. 2017-157063

(51) Int. Cl.
*H01S 5/02255* (2021.01)
*H01S 5/00* (2006.01)
(Continued)

(52) U.S. Cl.
CPC .......... *H01S 5/0087* (2021.01); *H01S 5/0071* (2013.01); *H01S 5/02255* (2021.01); *H01S 5/024* (2013.01); *H01S 5/028* (2013.01); *H01S 5/4075* (2013.01); *H01S 5/4081* (2013.01); *F21S 41/16* (2018.01); *F21S 41/176* (2018.01);
(Continued)

(58) Field of Classification Search
CPC ..................... H01S 5/02255; H01S 5/40–4093
See application file for complete search history.

(56) References Cited

U.S. PATENT DOCUMENTS

| | | |
|---|---|---|
| 4,484,334 A | 11/1984 | Pressley |
| 5,100,220 A | 3/1992 | Voegeli |

(Continued)

FOREIGN PATENT DOCUMENTS

| | | |
|---|---|---|
| EP | 3 358 245 A1 | 8/2018 |
| JP | S63-077178 A | 4/1988 |

(Continued)

OTHER PUBLICATIONS

Final Office Action on U.S. Appl. No. 17/512,212 Dtd Apr. 26, 2024.

(Continued)

*Primary Examiner* — Tod T Van Roy
(74) *Attorney, Agent, or Firm* — Foley & Lardner LLP

(57) ABSTRACT

A light emitting device includes: a semiconductor laser element configured to emit light in a first direction; a light-reflecting part having a light-reflecting surface; and a base member including: a bottom part, a wall part surrounding the bottom part and having an upper surface, a recess defined by the bottom part and the wall part, the recess being located inward of the upper surface of the wall part in a top view, a first wiring part including a first wiring region and a second wiring region provided on the upper surface of the wall part, and a second wiring part including a first wiring region and a second wiring region that are located in the recess.

20 Claims, 19 Drawing Sheets

Related U.S. Application Data

No. 16/103,905, filed on Aug. 14, 2018, now Pat. No. 11,189,987.

(51) Int. Cl.

| | |
|---|---|
| ***H01S 5/024*** | (2006.01) |
| ***H01S 5/028*** | (2006.01) |
| ***H01S 5/40*** | (2006.01) |
| *F21S 41/16* | (2018.01) |
| *F21S 41/176* | (2018.01) |
| *F21S 43/16* | (2018.01) |
| *H01S 5/02216* | (2021.01) |
| *H01S 5/0222* | (2021.01) |
| *H01S 5/02257* | (2021.01) |
| *H01S 5/323* | (2006.01) |

(52) U.S. Cl.

CPC ........... *F21S 43/16* (2018.01); *H01S 5/02216* (2013.01); *H01S 5/0222* (2013.01); *H01S 5/02257* (2021.01); *H01S 5/32341* (2013.01); *H01S 5/4025* (2013.01); *H01S 2301/206* (2013.01)

(56) References Cited

U.S. PATENT DOCUMENTS

| | | | | |
|---|---|---|---|---|
| 5,335,243 | A | 8/1994 | Kubena et al. | |
| 6,347,103 | B1 | 2/2002 | Song et al. | |
| 7,075,960 | B2 * | 7/2006 | Kohara | H01S 5/02325 372/36 |
| 7,376,166 | B2 | 5/2008 | Hata et al. | |
| 7,667,324 | B2 * | 2/2010 | Wang | B81C 1/00269 257/781 |
| 8,437,086 | B2 | 5/2013 | Du et al. | |
| 9,008,139 | B2 * | 4/2015 | Monadgemi | H01S 5/0222 372/44.01 |
| 9,748,733 | B2 | 8/2017 | Okahisa | |
| 9,985,411 | B2 | 5/2018 | Matsushita et al. | |
| 9,997,682 | B2 * | 6/2018 | Fujimori | H10H 20/857 |
| 10,203,079 | B2 | 2/2019 | Hadrath | |
| 10,218,151 | B1 | 2/2019 | Hwang et al. | |
| 10,862,276 | B2 | 12/2020 | Taji | |
| 10,920,937 | B2 * | 2/2021 | Kitajima | F21V 13/10 |
| 11,223,182 | B2 | 1/2022 | Nakanishi | |
| 11,527,864 | B2 * | 12/2022 | Kitajima | F21V 13/10 |
| 11,664,638 | B2 | 5/2023 | Kitajima et al. | |
| 11,721,950 | B2 | 8/2023 | Hara et al. | |
| 11,784,459 | B2 * | 10/2023 | Yamamoto | H01S 5/0235 372/44.01 |
| 11,962,121 | B2 | 4/2024 | Kitajima et al. | |
| 2001/0010702 | A1 | 8/2001 | Tanaka | |
| 2004/0208210 | A1 * | 10/2004 | Inoguchi | H01L 25/167 257/E33.072 |
| 2005/0092937 | A1 | 5/2005 | Tanaka | |
| 2007/0004110 | A1 | 1/2007 | Tanaka | |
| 2008/0112444 | A1 | 5/2008 | Inoue et al. | |
| 2010/0066979 | A1 | 3/2010 | Miyazaki | |
| 2010/0246159 | A1 | 9/2010 | Wada | |
| 2011/0279999 | A1 | 11/2011 | Takahashi | |
| 2012/0002137 | A1 | 1/2012 | Saito et al. | |
| 2012/0039072 | A1 | 2/2012 | Lell et al. | |
| 2013/0272329 | A1 | 10/2013 | Auen et al. | |
| 2014/0369064 | A1 | 12/2014 | Sakaue et al. | |
| 2015/0270682 | A1 | 9/2015 | Daniels et al. | |
| 2016/0087399 | A1 | 3/2016 | Horn et al. | |
| 2016/0131314 | A1 | 5/2016 | Waragaya | |
| 2016/0285234 | A1 | 9/2016 | Okahisa | |
| 2017/0003001 | A1 | 1/2017 | Sakaue et al. | |
| 2017/0033529 | A1 * | 2/2017 | Furuya | G02B 7/027 |
| 2017/0122505 | A1 | 5/2017 | Kiyota et al. | |
| 2017/0170625 | A1 | 6/2017 | Halbritter et al. | |
| 2017/0284634 | A1 | 10/2017 | Kiyota et al. | |
| 2017/0317469 | A1 | 11/2017 | Kiyota | |
| 2017/0338628 | A1 | 11/2017 | Matsushita et al. | |
| 2018/0058645 | A1 * | 3/2018 | Kiyota | F21V 9/30 |
| 2018/0182928 | A1 | 6/2018 | Namie | |
| 2018/0183214 | A1 | 6/2018 | Dawson et al. | |
| 2018/0216811 | A1 | 8/2018 | Fukakusa et al. | |
| 2019/0058303 | A1 | 2/2019 | Miura | |
| 2019/0234565 | A1 | 8/2019 | Kitajima et al. | |
| 2020/0083664 | A1 | 3/2020 | Miura et al. | |
| 2020/0116312 | A1 | 4/2020 | Kiyota | |
| 2021/0131619 | A1 | 5/2021 | Kitajima et al. | |
| 2021/0359492 | A1 * | 11/2021 | Kitagawa | H10H 20/8582 |
| 2022/0052506 | A1 | 2/2022 | Miura | |
| 2022/0094135 | A1 * | 3/2022 | Yamamoto | H01L 23/49827 |
| 2022/0149252 | A1 | 5/2022 | Yamashita et al. | |
| 2022/0190553 | A1 | 6/2022 | Kitajima et al. | |
| 2022/0216668 | A1 * | 7/2022 | Miura | H01S 5/0071 |
| 2022/0320823 | A1 * | 10/2022 | Kitagawa | H01L 23/047 |
| 2022/0376469 | A1 * | 11/2022 | Kitagawa | H01S 5/02255 |
| 2024/0044475 | A1 | 2/2024 | Kitajima | |
| 2025/0055250 | A1 * | 2/2025 | Nakagaki | H01S 5/02218 |

FOREIGN PATENT DOCUMENTS

| | | | | |
|---|---|---|---|---|
| JP | 2001-291681 | A | 10/2001 | |
| JP | 2009-289976 | A | 12/2009 | |
| JP | 2010-251686 | A | 11/2010 | |
| JP | 2013-130835 | A | 7/2013 | |
| JP | 2015-002160 | A | 1/2015 | |
| JP | 2015-173213 | A | 10/2015 | |
| JP | 2017-085036 | A | 5/2017 | |
| JP | 2017-107776 | A | 6/2017 | |
| JP | 2017-117880 | A | 6/2017 | |
| WO | WO-2017/056469 | A1 | 4/2017 | |
| WO | WO-2018/021414 | A1 | 2/2018 | |
| WO | WO-2020080539 | A1 * | 4/2020 | H10H 20/8506 |

OTHER PUBLICATIONS

Non-Final Office Action on U.S. Appl. No. 17/512,212 dated Nov. 7, 2023.

Final Office Action on U.S. Appl. No. 16/103,905 Dtd Oct. 7, 2019.

Non-Final Office Action on U.S. Appl. No. 16/103,905 Dtd May 28, 2019.

Notice of Allowance on U.S. Appl. No. 16/103,905 Dtd Aug. 2, 2021.

US Office Action on U.S. Appl. No. 16/103,905 Dtd Nov. 30, 2020.

US Office Action on U.S. Appl. No. 16/103,905 Dtd Apr. 30, 2021.

Non-Final Office Action in U.S. Appl. No. 17/512,212, dated Oct. 18, 2024.

Final Office Action in U.S. Appl. No. 17/512,212 dated Mar. 28, 2025.

Merriam-Webster's Dictionary ("on", https://www.merriam-Webster.com/dictionary/on) (Year: 2025).

Non-Final Office Action in U.S. Appl. No. 17/512,212 dated Jul. 21, 2025.

* cited by examiner

FIG. 12

VIII

XIII

LIGHT EMITTING DEVICE

CROSS-REFERENCE TO RELATED PATENT APPLICATIONS

The present application is a continuation of U.S. patent application Ser. No. 17/512,212, filed on Oct. 27, 2021, which is based on and claims the benefit of priority from U.S. patent application Ser. No. 16/103,905, filed on Aug. 14, 2018 (now U.S. Pat. No. 11,189,987), which claims priority under 35 U.S.C. § 119 to Japanese Patent Application No. 2017-157063, filed Aug. 16, 2017. The contents of these applications are incorporated herein by reference in their entireties.

BACKGROUND

Technical Field

The present disclosure relates to a light emitting device.

Description of the Related Art

A light emitting device described in Japanese Patent Publication No. 2010-251686 includes a semiconductor laser, a mirror having a total reflection film, and a fluorescent material arranged above the mirror. Laser light emitted from the semiconductor laser is reflected by the mirror provided with the total reflection film and is irradiated to the fluorescent material (for example, see FIG. 3 of Japanese Unexamined Patent Application Publication No. 2010-251686).

SUMMARY

In such light emitting devices, optical intensity of the laser light is higher at a center portion than its peripheral portion on a light-receiving surface of a fluorescent material. In such cases, a large quantity of heat is generated at the center portion of the fluorescent material, which may result in a decrease in the conversion efficiency of the fluorescent material. Also, light emission intensity and/or color unevenness may occur in the light emitted from the fluorescent material.

A light emitting device according to an embodiment of the present disclosure includes one or more semiconductor laser elements, each configured to emit a laser light, one or more light-reflecting parts, each having a light-reflecting surface configured to reflect the laser light emitted from a corresponding one of the one or more semiconductor laser elements, and a fluorescent part having a light-receiving surface configured to be irradiated with the laser light reflected at the light-reflecting surface of each of the one or more light-reflecting parts. An irradiated region is formed on the light-reflecting surface when the light-reflecting surface is irradiated with the laser light, and the irradiated region includes a first end and a second end opposite to the first end, located at two opposite ends of the irradiated region in a longitudinal direction. The light-reflecting surface of each of the one or more light-reflecting parts is arranged such that a portion of the laser light reflected at at least a first end of the irradiated region and a portion of the laser light reflected at a location other than the first end of the irradiated region are overlapped with each other on the light-receiving surface.

The light emitting device according to certain embodiments can reduce degradation of the wavelength conversion efficiency of the fluorescent part and also can reduce uneven color and/or uneven distribution of light emission intensity in light emitted from the fluorescent part.

BRIEF DESCRIPTION OF THE DRAWINGS

FIG. 12 is a diagram showing a simulation result of light intensity distribution at a first region of light-receiving surface of a fluorescent part in the light emitting device according to the first embodiment.

DETAILED DESCRIPTION

Certain embodiments of the present invention will be described below with reference to the accompanying drawings. The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation.

First Embodiment

Figure 1:
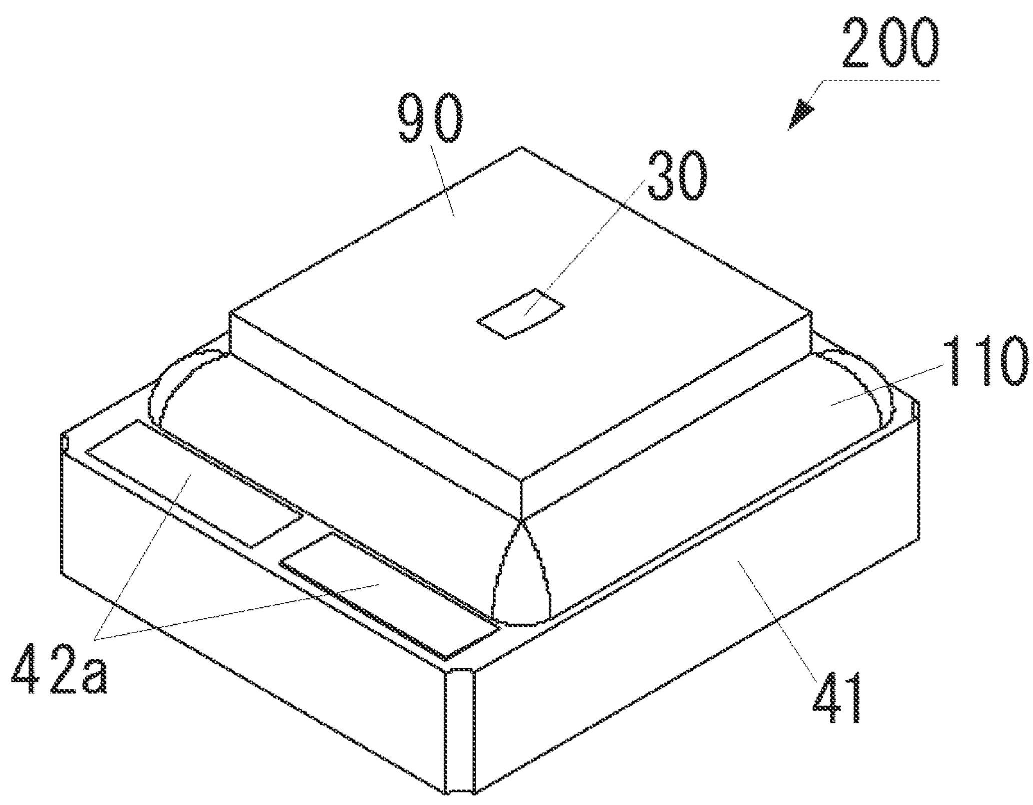
FIG. 1 is a schematic perspective view of a light emitting device according to a first embodiment of the present invention.
Figure 2:
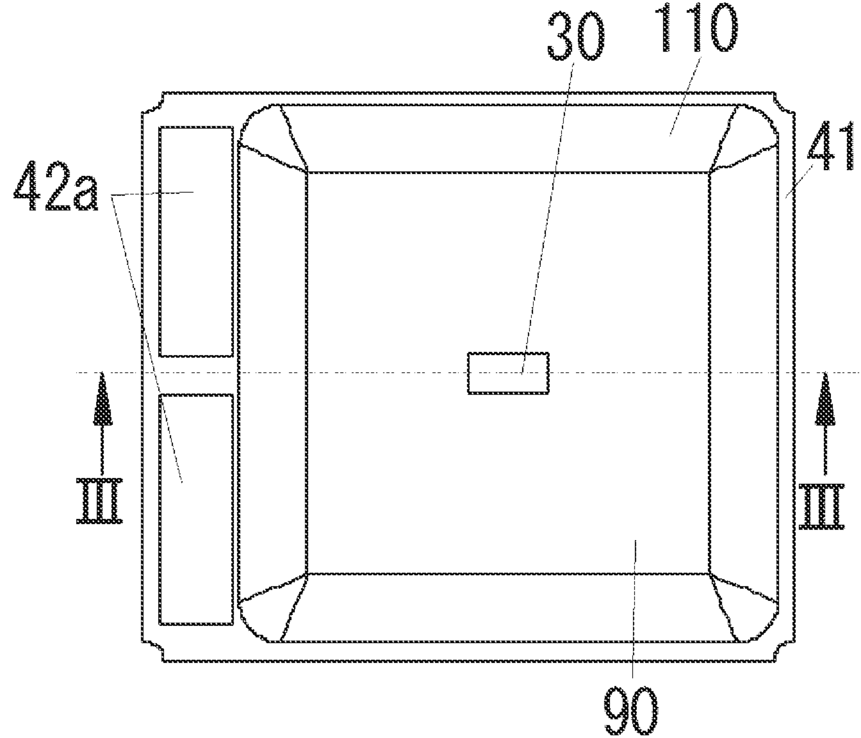
FIG. 2 is a schematic top view of the light emitting device according to the first embodiment.
Figure 3:
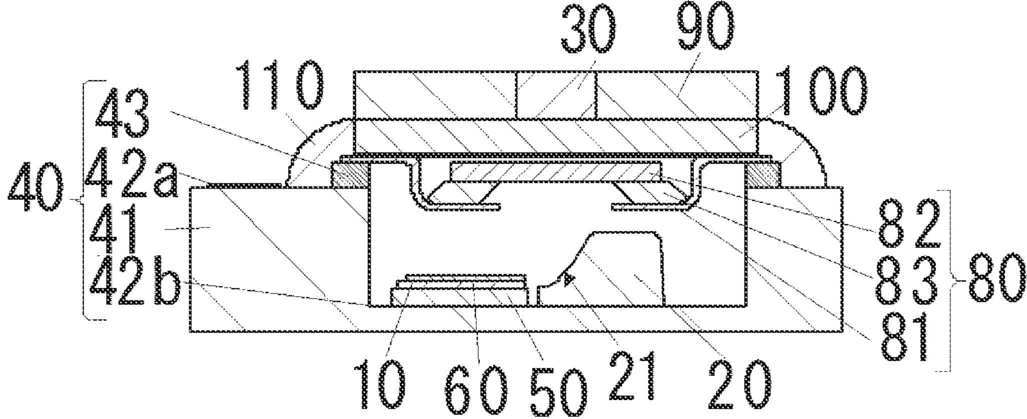
FIG. 3 is a schematic cross-sectional view taken along line of FIG. 2.
Figure 4:
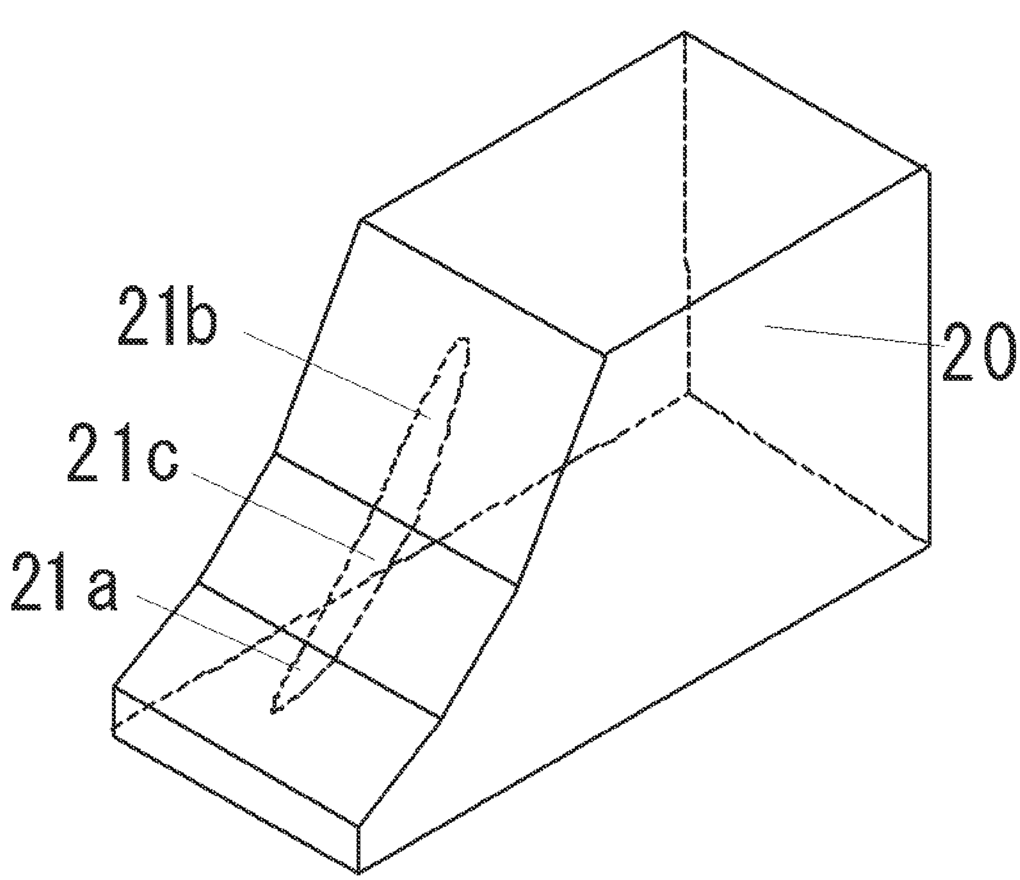
FIG. 4 is a schematic perspective view of an optical element included in the light emitting device according to the first embodiment.
Figure 5:
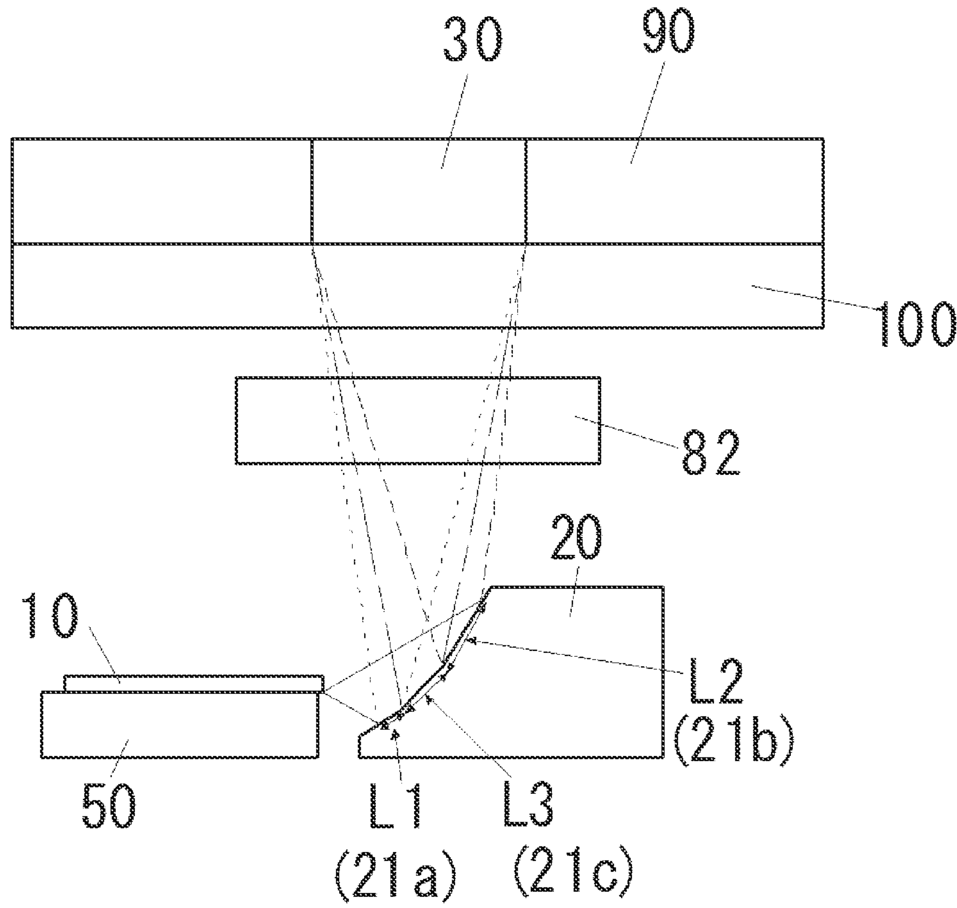
FIG. 5 is a diagram illustrating propagation of light emitted from a semiconductor laser element, reflected at a light-reflecting surface, and irradiated on a light-receiving surface of a fluorescent part, in the light emitting device according to the first embodiment.

FIG. 1 is a schematic perspective view of a light emitting device 200 according to a first embodiment, FIG. 2 is a schematic top view of the light emitting device 200, and FIG. 3 is a cross-sectional view taken along line of FIG. 2. FIG. 4 is a schematic perspective view of an optical element 20 that serves as a light-reflecting part 20 in the light emitting device 200. FIG. 5 is a cross-sectional diagram illustrating propagation of light emitted from a semiconductor laser element 10, reflected at a light-reflecting surface 21, and irradiated on a light-receiving surface of a fluorescent part 30, in the light emitting device 200.

As shown in FIG. 1 to FIG. 5, the light emitting device 200 includes one or more semiconductor laser elements 10, each configured to emit laser light having a far field pattern (hereinafter may be referred to as FFP) with an elliptic shape, a light-reflecting part 20 having a light-reflecting surface 21 configured to reflect the laser light, and a fluorescent part 30 having a light-receiving surface configured to be irradiated with the laser light reflected from the light-reflecting surface 21, the fluorescent part 30 being configured to emit fluorescent light upon being irradiated with the reflected laser light. In the light emitting device 200, a region of the light-reflecting surface 21 where the laser light is irradiated corresponds to the elliptic shape of the FFP and includes a first region 21*a* and a second region 21*b*. The FFP is divided in two or more regions in its longitudinal direction, including a first region 21*a* corresponding to a region at a first end of the FFP and a second region 21*b* corresponding to a region at a second end of the FFP that is opposite the first end. The first region 21*a* and the second region 21*b* are arranged such that a portion of the laser light reflected at the first region 21*a* at a location closer to the second region, and a portion of the laser light reflected at the second region 21*b* at a location away from the first region, are overlapped with each other on the light-receiving surface of the fluorescent part 30, and also a portion of the laser light reflected at the first region 21*a* at a location away from the first region 21*a*, and a portion of the laser light reflected at the second region 21*b* at a location closer to the first region 21*a*, are overlapped with each other on the light-receiving surface of the fluorescent part 30.

In the light emitting device 200, uneven distribution of light emission intensity and/or color unevenness in a light emitted from the fluorescent part 30 can be reduced, while reducing degradation of the wavelength conversion efficiency of the fluorescent part 30. More details thereof will be described below.

Figure 6:
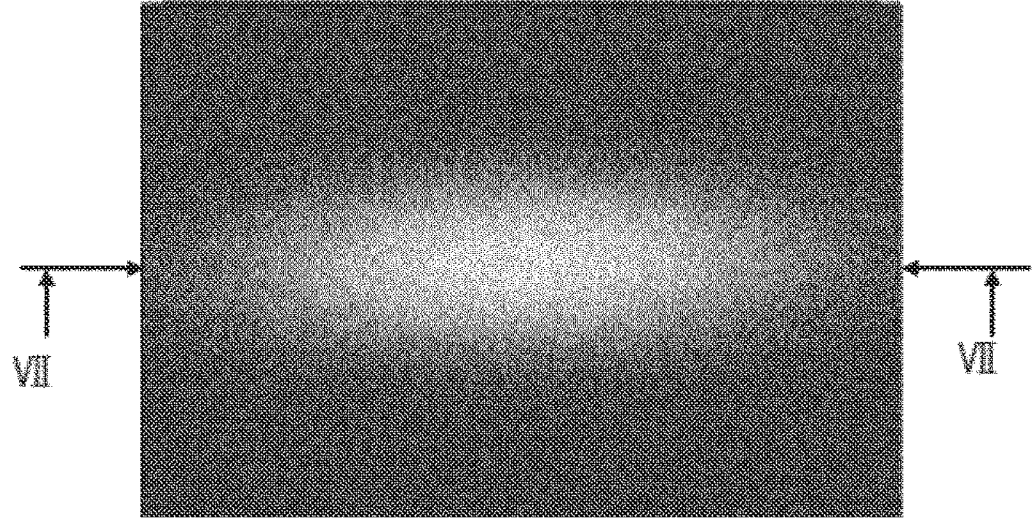
FIG. 6 is a diagram showing a simulation result of light intensity distribution of light reflected at a conventional light-reflecting surface.
Figure 7:
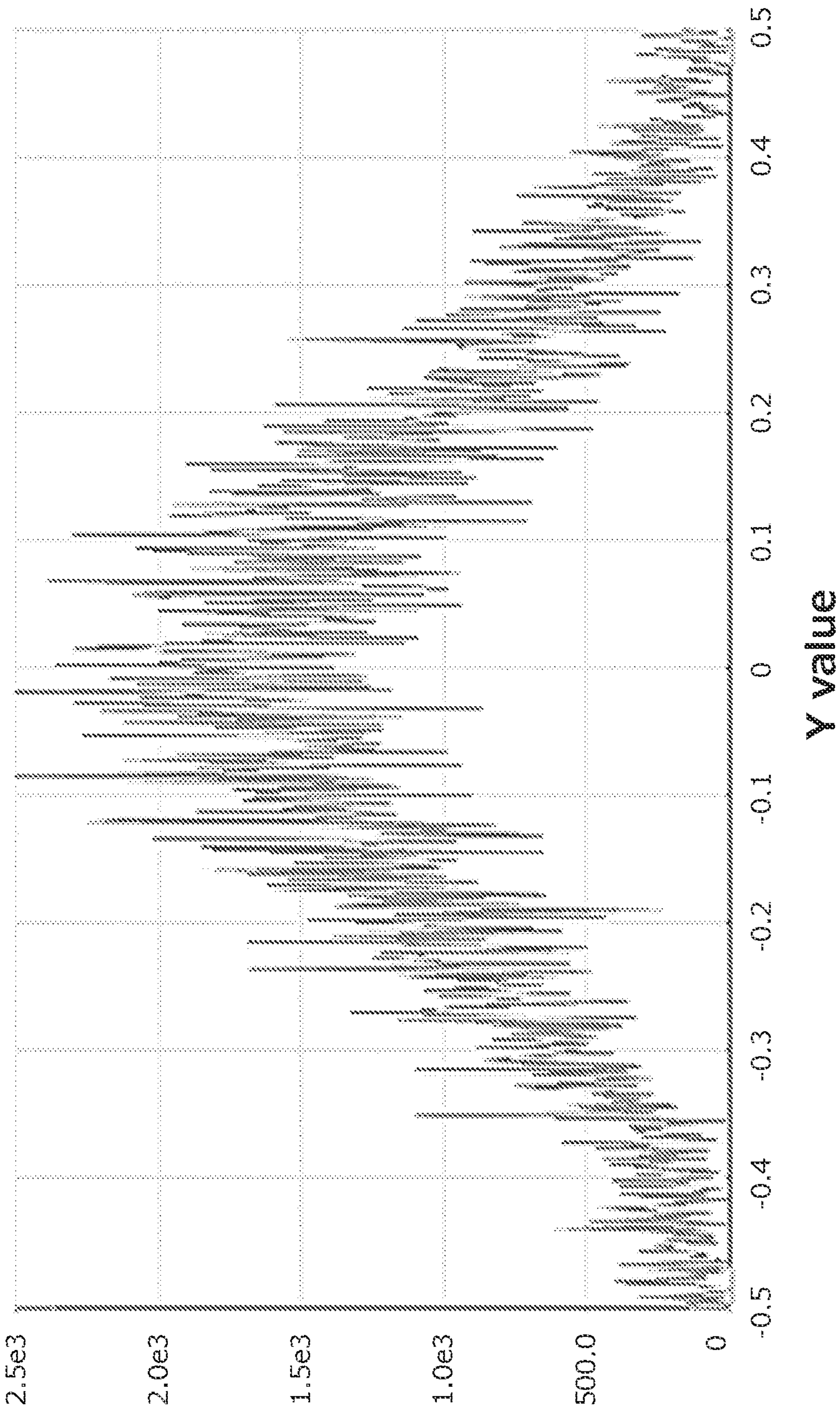
FIG. 7 is a diagram showing a light intensity distribution along the straight line between the points VII-VII indicated in FIG. 6.

Laser light emitted from the semiconductor laser element 10 (hereinafter may be referred to as "laser diode (LD) element 10") has a FFP of an elliptic shape that is longer in the layering direction of the semiconductor layers including the active layer and shorter in a direction perpendicular to the layering direction. The FFP in the present specification is obtained by measuring a light intensity distribution of the laser light in a plane parallel to the light emitting surface and at a certain distance from the light emitting surface of the LD element 10, and determined, for example, as a shape corresponding to a certain optical intensity such as at $1/e^2$ of the peak intensity. The laser light having such a FFP has an optical intensity greater at a center portion of the elliptic shape than at portions away from the center portion. In conventional light emitting devices, for example, the laser light emitted from an LD element is reflected at a light-reflecting surface inclined at 45 degrees to irradiate a light-receiving surface of a fluorescent part. In such cases, the reflected laser light is irradiated on the light-receiving surface of the fluorescent part while maintaining the light intensity distribution of the FFP. This can be seen in FIG. 6 and FIG. 7, which illustrate a simulation result of light intensity distribution of laser light reflected at a conventional light-reflecting surface. FIG. 7 is a diagram showing a light intensity distribution along the straight line between the points VII-VII indicated in FIG. 6, in which the optical intensity at the center portion is apparently greater than the peripheral portion. When such light is irradiated on the fluorescent part, the quantity of heat generated from the fluorescent part is greater at the portion of higher optical intensity than at its peripheral portion, which may result in degradation of the wavelength conversion efficiency of the fluorescent part. Further, a difference in the intensity of the laser light irradiated to the portions of the fluorescent part may result in the light emitting device having uneven optical intensity and/or color unevenness.

Accordingly, in the light emitting device 200, a first region 21*a* and a second region 21*b* are provided in a region of the light-reflecting surface 21 to be irradiated with the laser light such that the laser light reflected at the light-reflecting surface 21 is irradiated on the light-receiving surface of the fluorescent part 30 with a light intensity distribution approaching uniformity. As shown in FIG. 5, the first region 21*a* and the second region 21*b* are arranged such that a portion with lower light emission intensity in the laser light reflected at the first region 21*a* (in FIG. 5, laser light reflected near the left end of the first region 21*a*) and a portion with higher light emission intensity in the laser light reflected at the second region 21*b* (in FIG. 5, laser light reflected near the left end of the second region 21*a*) are overlapped with each other on the light-receiving surface, and a portion with higher light emission intensity in the laser light reflected at the first region 21*a* (in FIG. 5, laser light reflected near the right end of the first region 21*a*) and a portion with lower light emission intensity in the laser light reflected at the second region 21*b* (in FIG. 5, laser light reflected near the right end of the second region 21*a*) are overlapped with each other. With this arrangement, the light intensity distribution of the laser light irradiated at the light-receiving surface of the fluorescent part 30 can approach uniformity. Accordingly, the light emitting device 200 can realize a reduction of uneven light emitting intensity and uneven color while reducing degradation of the wavelength conversion efficiency of the fluorescent part 30.

The components of the light emitting device body 200 will be described below.

Base Member 40

A base member 40 is for mounting one or more LD elements 10. In FIG. 3, a base member 40 formed with a recess is used, and an LD element 10 is disposed on the bottom surface in the recess.

For the base member 40, a material containing ceramics can be used. Examples of ceramics include aluminum oxide, aluminum nitride, silicon nitride, and a silicon carbide. In the case where the base member 40 and a cover 80 are fixed by welding, a portion of the base member to be in contact with the cover 80 (welding part 43) can be formed with a material that contains iron as its main component.

Figure 8:
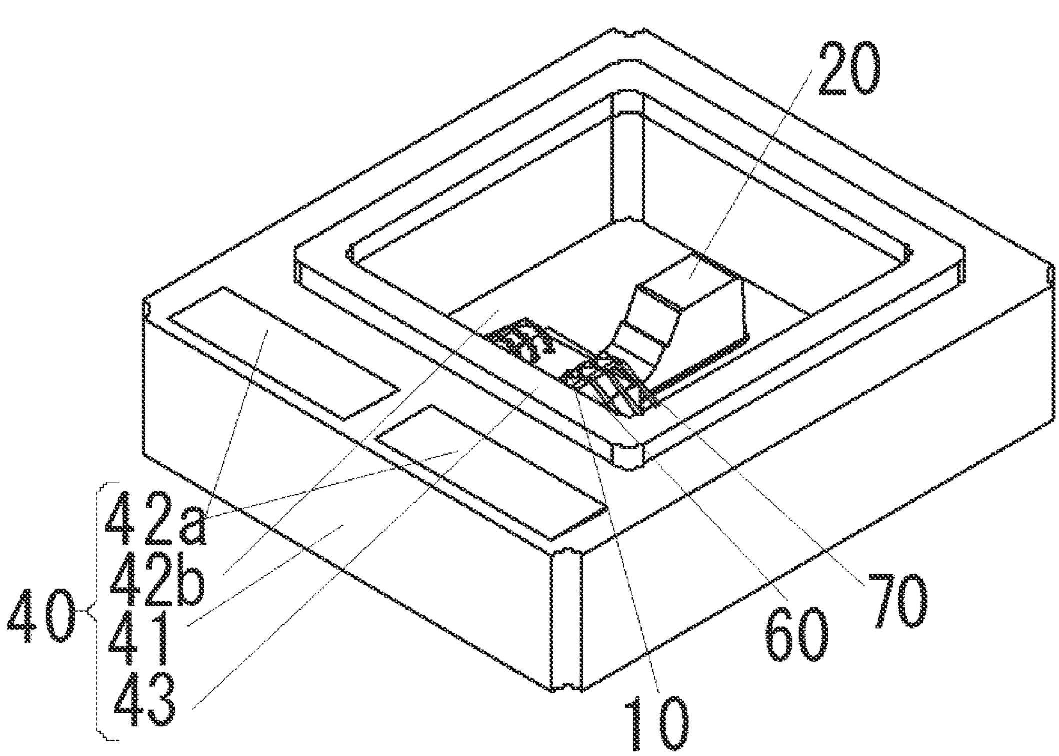
FIG. 8 is a schematic perspective view illustrating a configuration in a recess defined in a base member of the light emitting device according to the first embodiment.
Figure 9:
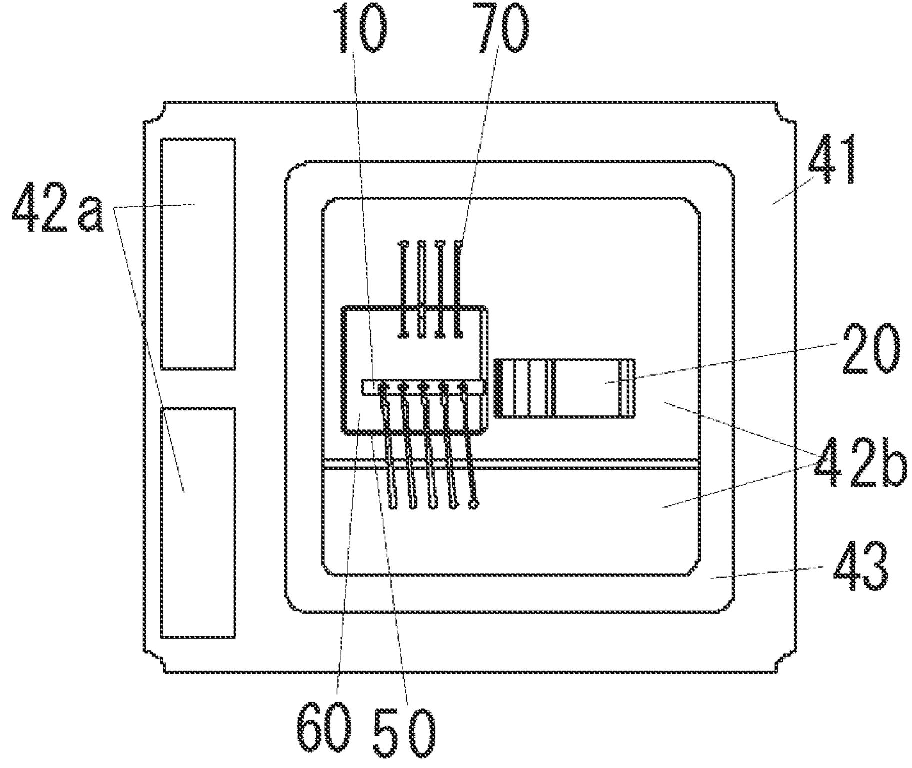
FIG. 9 is a schematic top view illustrating a configuration in a recess defined in a base member of the light emitting device according to the first embodiment.

As shown in FIG. 8 and FIG. 9, the base member 40 provided with the recess includes a main part 41 made of an electrically insulating material, a first wiring part 42*a* and a second wiring part 42*b* respectively exposed from the main part 41 on the bottom surface of the recess, and the welding part 43 to be contact with the cover 80. The first electrode 42*a* to be electrically connected to the outside are exposed on a surface other than the lower surface of the main part 41, which allows the entire surface of the lower surface of the base member 40 can be used for mounting to other member such as a heat sink, thus facilitating dissipation of heat generated in the light emitting device 200.

The base member may include a base part and a frame part disposed on an upper surface of the base part. In such a case, one or more LD elements can be disposed on the upper surface of the base part and inward of the frame part. The wiring portions in such a case are preferably disposed on the upper surface of the base part and outside of the frame part, in view of heat dissipation performance of the light emitting device.

Semiconductor Laser Element 10

The one or more LD elements 10 are configured to emit laser light having a FFP of an elliptic shape. Each one of the LD elements 10 has a light emitting surface perpendicular to the lower surface of the base member 40, and is arranged such that a longitudinal direction of its FFP in a elliptic shape is perpendicular to the lower surface of the base member 40. With this arrangement, a larger surface of the LD element 10 can be arranged in parallel to the lower surface of the base member 40, which facilitates dissipation of heat generated from the LD element 10 to the base member 40 and a heat sink. The term "perpendicular" used above includes an inclination to some degree, such as that caused by misalignment at the time of mounting.

The LD element 10 having an emission peak wavelength in a range of 320 nm to 530 nm, typically in a range of 430 nm to 480 nm can be used. The LD element 10 of the range described above emits laser light of relatively high energy, which is likely to cause degradation of the wavelength conversion efficiency of the fluorescent part 30. Employing the light-reflecting surface 21 and the like of the present embodiment can yield advantageous effects when using such a LD element 10. For the LD element 10 of the range described above, a material including a nitride semiconductor can be preferably used. Examples thereof include at least one of GaN, InGaN, and AlGaN.

The one or more LD elements 10 are mounted on the base member 40 via a sub-mount 50. With this arrangement, a distance from the light emitting point on the light emitting surface of the LD element 10 to the mounting surface (the bottom surface of the recess in the case of the light emitting device 100) of the LD 10 on the base member 40 can be increased by the thickness of the mount 50. Accordingly, laser light of the LD element can be efficiently irradiated on the light-reflecting surface 21. The LD element 10 can be fixed on the sub-mount 50 by using an electrically conductive layer 60 of Au—Sn etc.

The sub-mount 50 is preferably made of a material having a thermal expansion coefficient between the thermal expansion coefficient of the base member 40 and the thermal expansion coefficient of the LD element. Accordingly, detachment of the LD element 10 and/or detachment of the sub-mount 50 can be reduced. When a material containing a nitride semiconductor is used for the LD element 10, a sub-mount 50 made of, for example, aluminum nitride or silicon carbide can be used.

As shown in FIG. 8 and FIG. 9, the LD element 10 is electrically connected to the second wiring portion 42*b* of the base member 40 via wires (i.e., thin metal wire) 70.

Light-Reflecting Part 20

The light-reflecting part 20 is configured to reflect the laser light from the LD element 10 toward the fluorescent part 30. As in the light emitting device 200, when the laser light from the LD element 10 is reflected at the light-reflecting part 20, more uniform intensity of laser light can be irradiated on the light-receiving surface of the fluorescent part 30, while allowing a reduction in the thickness (the length in up- and down direction in FIG. 3) of the light emitting device 200, compared to the case of using a light-transmissive lens.

As shown in FIG. 3, an optical element 20 having at least one light-reflecting surface 21 is employed as the light-reflecting part 20. The base member 40 and the optical element 20 are provided separately, which allows for adapting a simpler structure for the base member 40 compared to the case in which a part of the base member is also used as the light-reflecting surface. On the other hand, the base member can be structured so that a part of the base member serves as the light-reflecting surface. In such a case, a need of a region for movement of a collet used to disposing the optical element can be eliminated, and thus the width of the recess in the base member can be reduced.

In the present specification, surfaces of the optical element 20 other than the upper surface and the lower surface are lateral surfaces. In the light emitting device 200, as shown in FIG. 3 and FIG. 4, one of four lateral surfaces of the optical element 20 located closer to the LD element 10 is the light-reflecting surface 21. Using a lateral surface located closer to the LD element 10 as the light-reflecting surface 21 can reduce the number of interfaces that the laser light to pass through, compared to the case where a lateral surface located away from the LD element 10 is used as the light-reflecting surface, accordingly, absorption of light by the optical element can be reduced.

The optical element 20 can include a main component that is resistant to heat, such as quartz or glass such as BK7, or a metal such as aluminum, and has a light-reflecting surface 21 made of a material having high reflectance such as a metal.

In the light emitting device 200, the light-reflecting surface 21 is formed to obtain more uniform light intensity distribution in the longitudinal direction of the elliptic FFP of the laser light irradiated on the light-receiving surface. This is because the FFP of the laser light emitted from the LD element 10 tends to spread particularly in the longitudinal direction. The light-reflecting surface may be formed such that the light intensity distribution in the transverse direction also approaches uniformity, but in view of accuracy of the light-reflecting surface of the optical element and positional alignment with the LD element, the light-reflecting surface 21 is preferably formed such that the light intensity distribution in the longitudinal direction of the elliptic FFP on the light-receiving surface approaches uniformity.

As shown in FIG. 4, a region of the light-reflecting surface 21 (region surrounded by the alternate long and short dashed line in FIG. 4) where the laser light is irradiated includes a first region 21*a* corresponding to a first end and a second region 21*b* corresponding to a second end that is opposite side of the first end of two or more portions of the elliptic shape of FFP that is divided in its longitudinal direction. Further, as shown in FIG. 4, the first region 21*a* and the second region 21*b* are arranged on the light-receiving surface of the fluorescent part 30 such that a portion of the laser light reflected at the first region 21*a* at a location closer to the second region 21*b*, and a portion of the laser light reflected at the second region 21*b* at a location away from the first region 21*a*, are overlapped with each other, and a portion of the laser light reflected at the first region 21*a* at a location away from the second region 21*b*, and a portion of the laser light reflected at the second region 21*b* at a location closer to the first region 21*a*, are overlapped with each other.

The first region 21*a* and the second region 21*b* are respectively arranged such that, on the light-receiving surface of the fluorescent part 30, the light intensity distribution of the laser light reflected at the first region 21*a* and the light intensity distribution of the laser light reflected at the second region 21*b* are in line symmetry to a direction corresponding to the longitudinal direction. That is, the first region 21*a* and the second region 21*b* are arranged such that the laser light reflected at the first region 21*a* and the second region 21*b* are overlapped with each other with a same width on the light-receiving surface. Accordingly, the light intensity distribution on the light-receiving surface can be facilitated to approach uniformity.

For example, as shown in FIG. 5, the area of the first region 21*a* that is located closer to the LD element 10 than the second region 21*b* is smaller than the area of the second region 21*b*. The first region 21*a* located closer to the LD element 10 has a greater distance, and thus a greater divergence, than that of the second region 21*b* to the light-receiving surface of the fluorescent part 30. Accordingly, the arrangement described above can facilitate overlapping of the first region 21*a* and the second region 21*b* with a same width on the light-receiving surface.

In the light emitting device 200, the region on the light-reflecting surface 21 to be irradiated with the laser light has a third region 21*c* located between the first region 21*a* and the second region 21*b*. As shown in FIG. 5, the third region 21*c* is arranged such that a portion of light reflected at the third region 21*c* at a location closer to the first region 21*a*, and a portion of light reflected at the first region 21*a* at a location away from the second region 21*b* are overlapped with each other on the light-receiving surface of the fluorescent part 30, and also a portion of light reflected at the third region 21*c* at a location closer to the second region 21*b*, and a portion of light reflected at the second region 21*b* at a location away from the first region 21*a* are overlapped with each other on the light-receiving surface of the fluorescent part 30. That is, a portion with lower light emission intensity in the laser light reflected at the third region 21*c* (laser light reflected near the left end and the right end of the third region 21*c* in FIG. 5) and a portion with higher light intensity in the laser light reflected at the first region 21*a* and the second region 21*b* (laser light reflected near the right end of the first region 21*a* and laser light reflected near the left end of the second region 21*b* in FIG. 5) can be overlapped with each other. When the light-reflecting surface 21 has the third region 21*c* in addition to the first region 21*a* and the second region 21*b*, a degree of divergence of the light reflected at the light-reflecting surface 21 can be decreased compared to that when the light-reflecting surface 21 has only the first region 21*a* and the second region 21*b*. Accordingly, a need for an increase of the longitudinal length of the light-receiving surface of the fluorescent part 30 can be smaller with respect to an increase of the distance between the light-reflecting surface 21 and the light-receiving surface of the fluorescent part 30. Four or more regions may be provided on the light-reflecting surface 21 to be irradiated with the laser light.

The first region 21*a*, the second region 21*b*, and the third region 21*c* are arranged such that in the longitudinal direction of the FFP, the divergence angles of the laser light reflected at the first region 21*a* and the second region 21*b* are smaller than the divergence angle of the laser light reflected at the third region 21*c*. That is, the light-reflecting surface 21 is formed such that in the longitudinal direction of the elliptic FFP, outward spreading of a portion of light reflected at the third region 21*c* and having higher light emission intensity is facilitated while spreading of portions of light respectively reflected at the first region 21*a* and the second region 21*b* locations away from the third region 21*c* are reduced. With this arrangement, the light intensity distribution on the light-receiving surface can be made approaching uniformity while reducing spreading of the laser light irradiated on the light-receiving surface of the fluorescent part 30.

As shown in FIG. 4, the first region 21*a*, the second region 21*b*, and the third region 21*c* are flat surfaces. That is, the light-reflecting surface 21 is formed with three flat surfaces. This arrangement can facilitate the designing of the optical element 20. The first region, the second region, and the third region may each be a curved surface.

Figure 10:
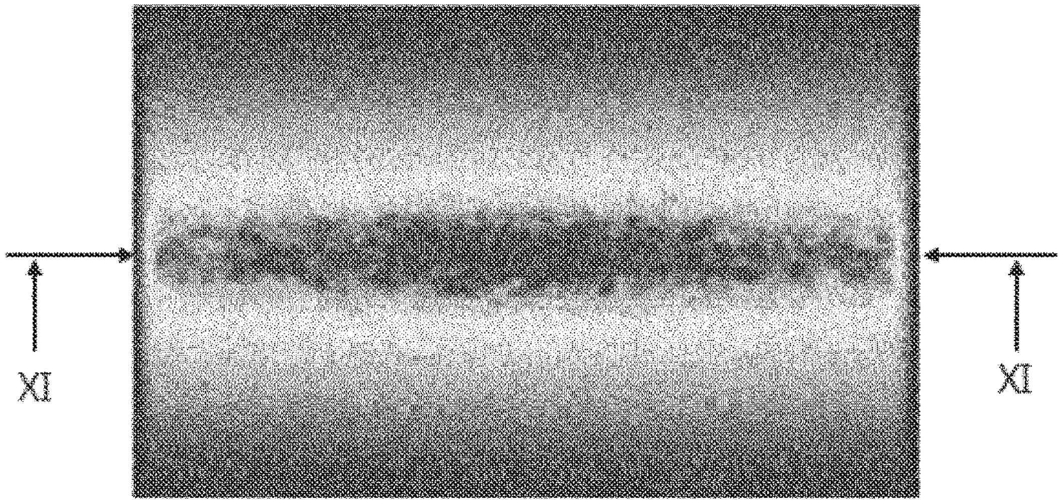
FIG. 10 is a diagram showing a simulation result of light intensity distribution at a light-receiving surface of a fluorescent part in the light emitting device according to the first embodiment.
Figure 11:
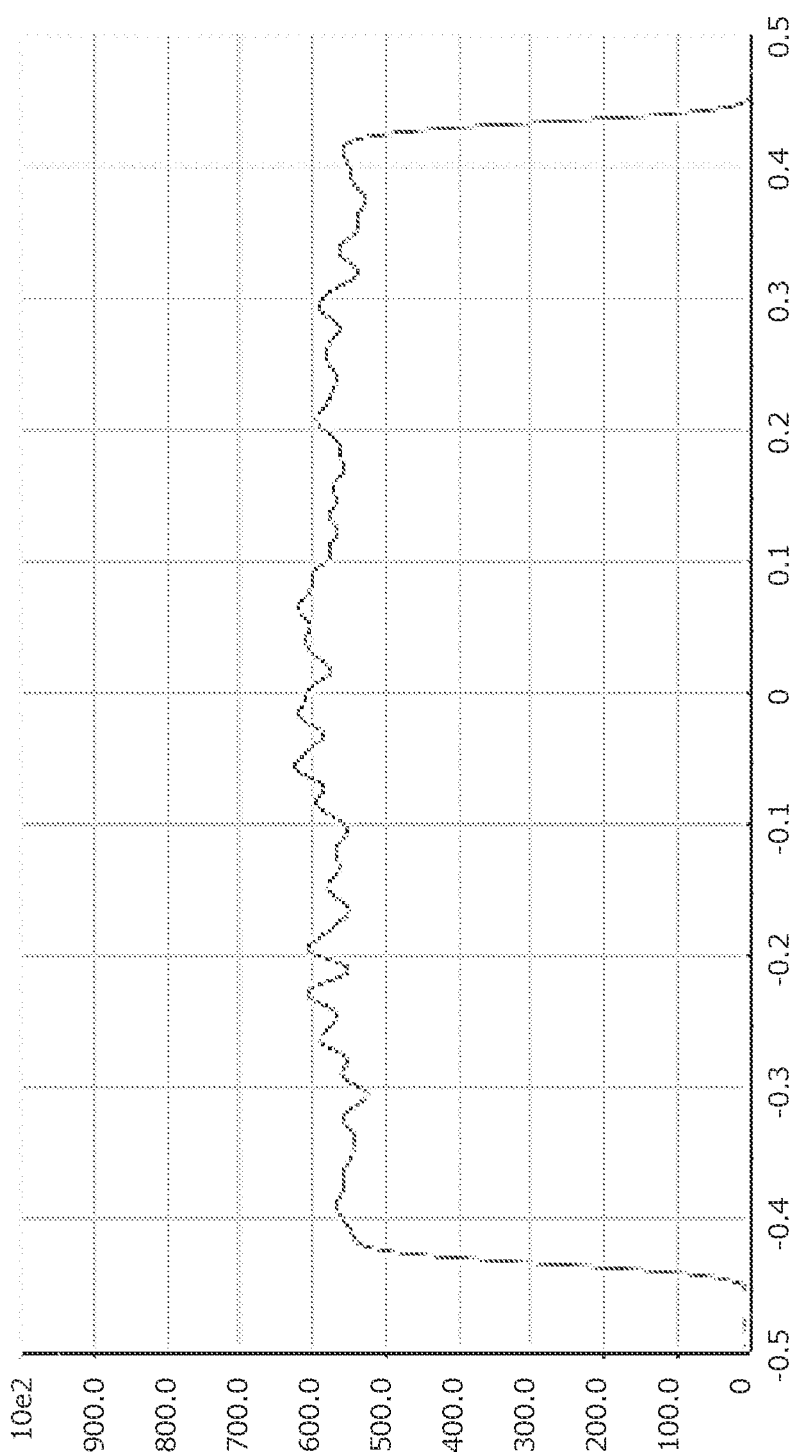
FIG. 11 is a diagram showing a light intensity distribution along the straight line between the points XI-XI indicated in FIG. 10.
Figure 12:
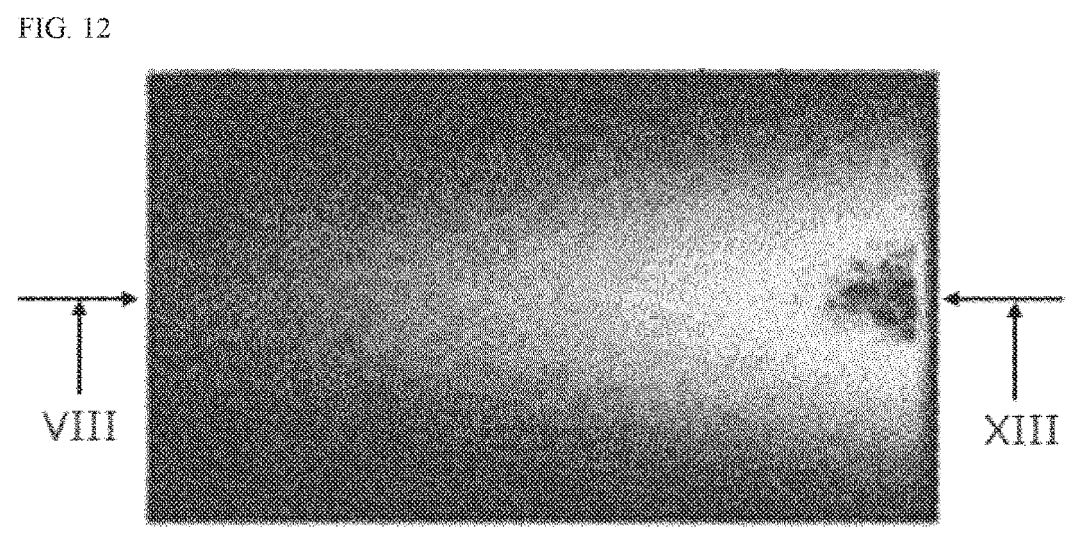
Figure 13:
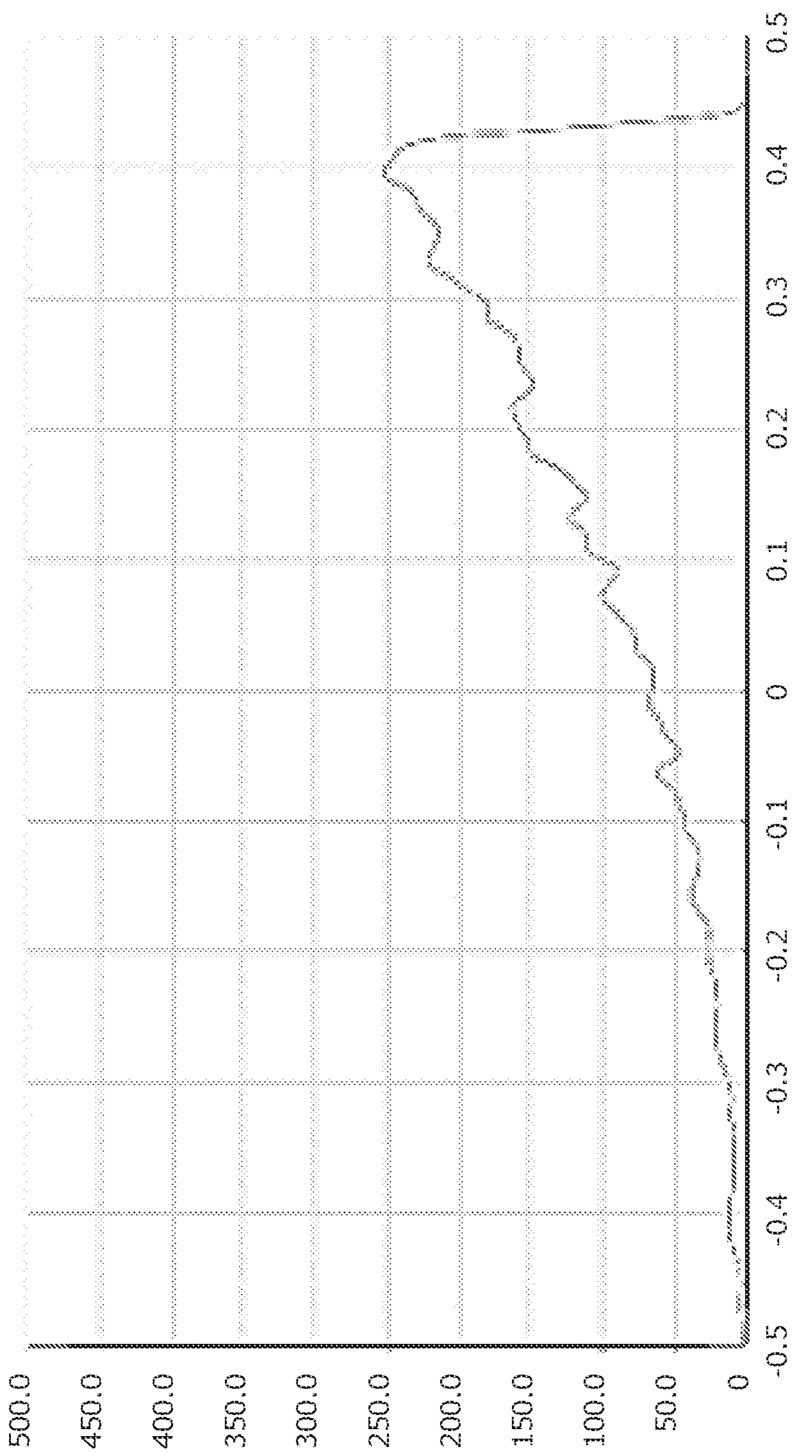
FIG. 13 is a diagram showing a light intensity distribution along the straight line between the points XIII-XIII indicated in FIG. 12.
Figure 14:
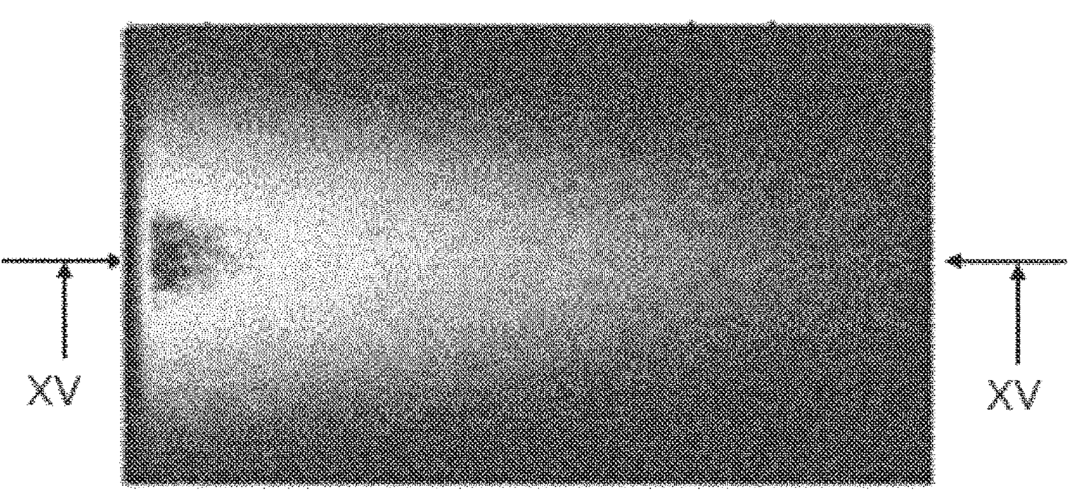
FIG. 14 is a diagram showing a simulation result of light intensity distribution at a second region of light-receiving surface of a fluorescent part in the light emitting device according to the first embodiment.
Figure 15:
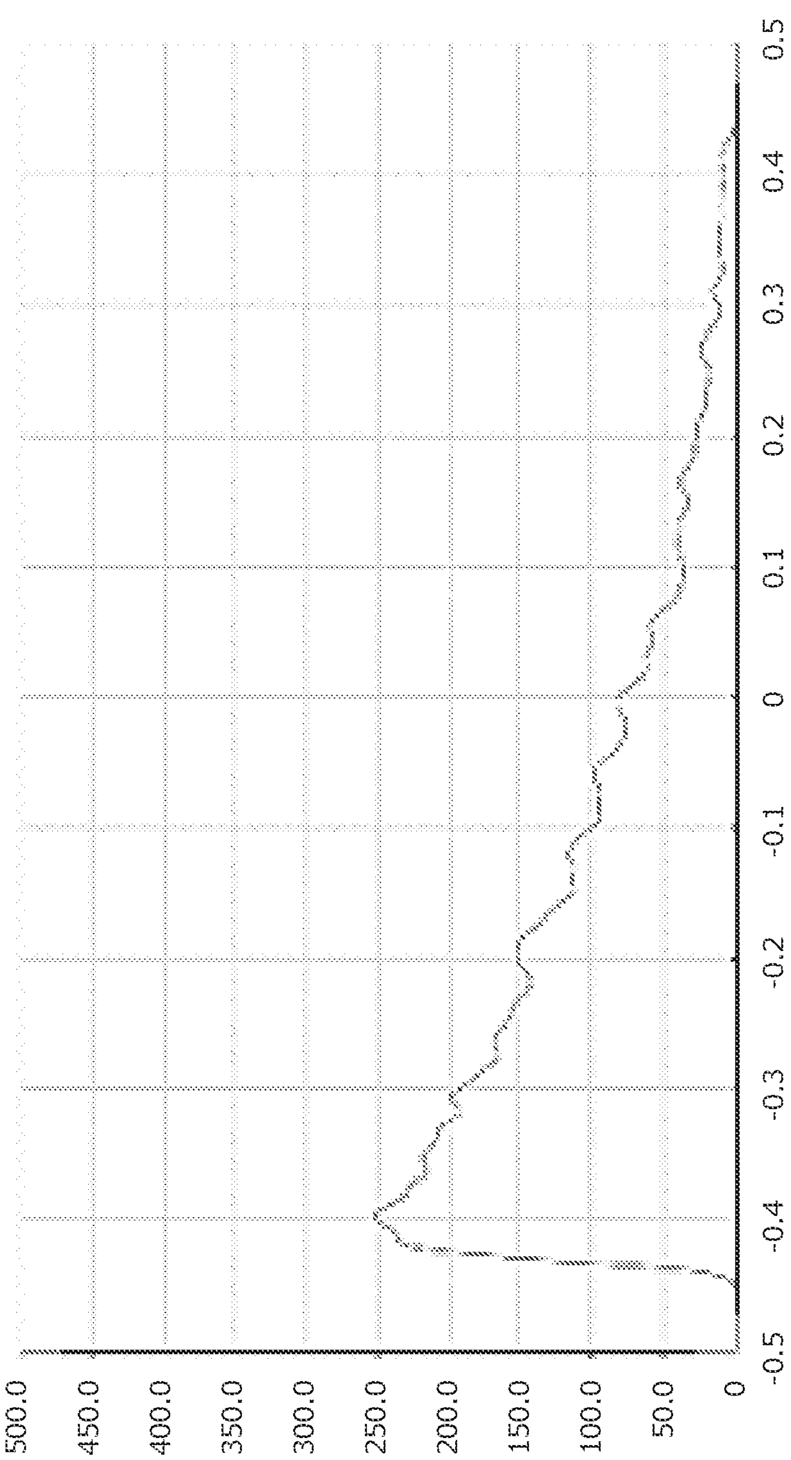
FIG. 15 is a diagram showing a light intensity distribution along the straight line between the points XV-XV indicated in FIG. 14.
Figure 16:
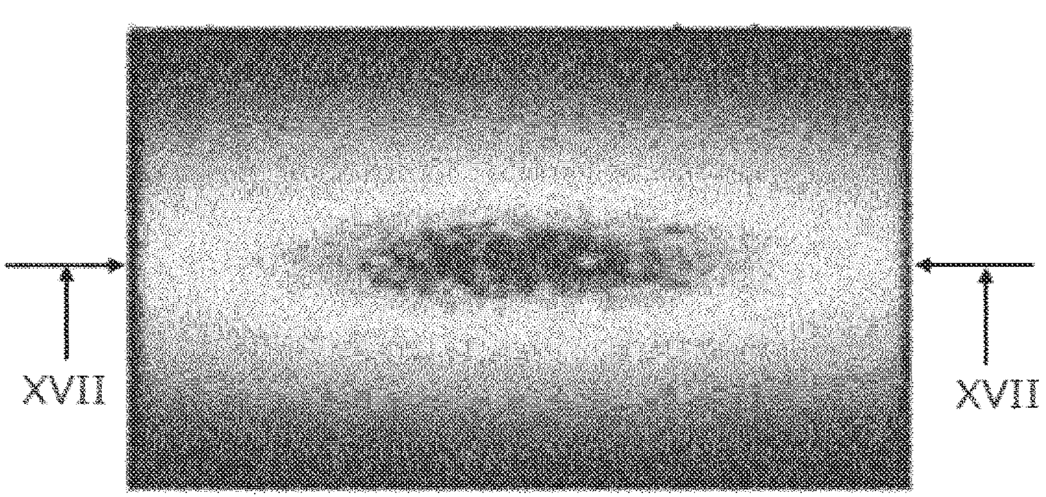
FIG. 16 is a diagram showing a simulation result of light intensity distribution at a third region of light-receiving surface of a fluorescent part in the light emitting device according to the first embodiment.
Figure 17:
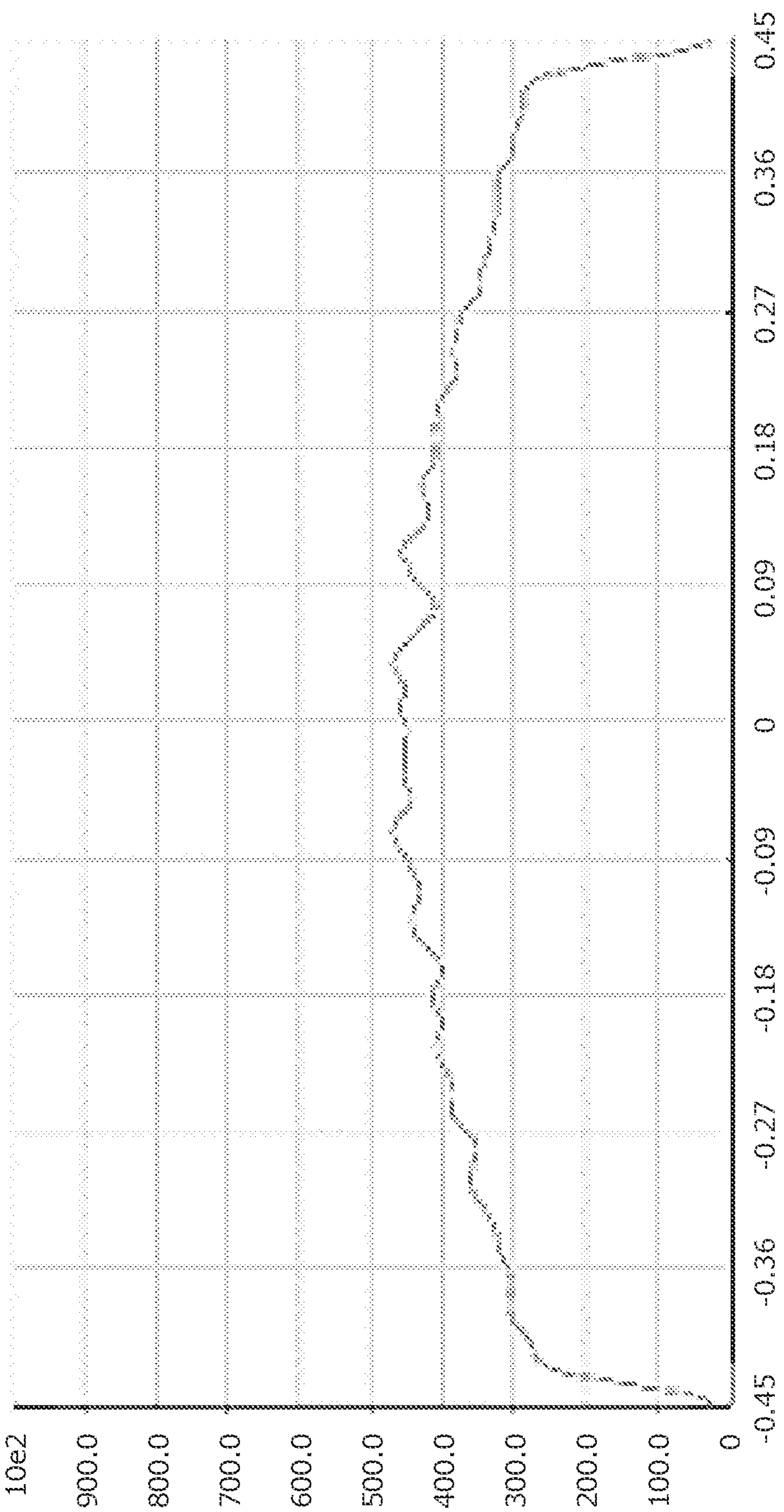
FIG. 17 is a diagram showing a light intensity distribution along the straight line between the points XVII-XVII indicated in FIG. 16.

FIG. 10 is a diagram showing a simulation result of light intensity distribution at the light-receiving surface of the fluorescent part 30 in the light emitting device 200. FIG. 11 is a diagram showing a light intensity distribution along the straight line between the points XI-XI indicated in FIG. 10. FIG. 12 is a diagram showing a simulation result of light intensity distribution at the first region 21*a* of the light-receiving surface of the fluorescent part 30, and FIG. 13 is a diagram showing a light intensity distribution along the straight line between the points XIII-XIII indicated in FIG. 12. FIG. 14 is a diagram showing a simulation result of light intensity distribution at the second region 21*b* of the light-receiving surface of the fluorescent part 30, and FIG. 15 is a diagram showing a light intensity distribution along the straight line between the points XV-XV indicated in FIG. 14. FIG. 16 is a diagram showing a simulation result of light intensity distribution at the third region 21*c* of the light-receiving surface of the fluorescent part 30, and FIG. 17 is a diagram showing a light intensity distribution along the straight line between the points XVII-XVII indicated in FIG. 16. Next, the conditions of the simulation will be described with reference to FIG. 5. The distance between the light emitting point of the LD element and the light-reflecting surface 21 (more precisely, a first light-reflecting point) in a direction parallel to the lower surface of the optical element 20 and the lower surface of the LD element 10 was set to 0.45 mm, and the distance between the light-reflecting surface (i.e., the first light-reflecting point) and the light-receiving surface of the fluorescent part 30 in a direction perpendicular to the lower surface of the optical element 20 is set to 2.10 mm. The laser light emitted from the light emitting point propagating in parallel to the lower surface of the LD element 10 is irradiated at the first light-reflecting point of the light-reflecting surface 21. In the case shown in FIG. 5, a light-transmissive member 82 having a thickness of 0.5 mm and a heat-releasing member 100 having a thickness of 0.43 mm are disposed between the first light-reflecting point and the fluorescent part 30. The width in the longitudinal direction of the light-receiving surface of the fluorescent part 30 (i.e., the length of the light-receiving surface of the fluorescent part 30 in a direction parallel to the light emitting point and the first light-reflecting point) was set to 1 mm, and the width of the transverse direction was set to 0.5 mm. Further, in the optical element 20, the angle between the lower surface and the first region 21*a* was set to 31.5 degrees, the angle between the lower surface and the second region 21*b* was set to 60 degrees, and the angle between the lower surface and the third region 21*c* was set to 45 degrees. The length L1 of the first region 21*a* was set to 0.14 mm, the length L2 of the second region 21*b* was set to 0.36 mm, and the length L3 of the third region 21*c* was set to 0.27 mm. As shown in FIG. 11, the light emitting device 200 can produce the light intensity distribution of the laser light approaching uniformity at the light-receiving surface of the fluorescent part 30.

Cover 80

Combined with the base member 40, the cover 80 hermetically seals the space in which the LD element 10 is disposed. Accordingly, accumulation of dust attracted to the light emitting surface of the LD element 10 can be reduced. The cover 80 includes a support 81, a light-transmissive part 82, and a bonding member 83 bonding the support 80 and the light-transmissive part 82. The laser light reflected at the light-reflecting surface 21 is transmitted through the light-transmissive part 28 and is irradiated on the light-receiving surface of the fluorescent part 30.

In the light emitting device 200, a material that contains a nitride semiconductor is used as the LD element, and the support 81 of the cover 80 and the base member 40 are fixed by welding. In this case, a material whose main component is iron can be used for the support 81. Also, in the light emitting device 200, an LD element 10 and an optical element 20 are disposed in a single space that is hermetically sealed by the base member 40 and the cover 80. With this arrangement, compared to light emitting devices that include an LD device mounted with an LD element and an optical element disposed outside of the LD device, an increase in the size of the light emitting device 200 can be reduced. For the light-transmissive part 82, for example, glass or sapphire can be used, and for the bonding material 83, for example, a low-melting point glass or a gold-tin-based solder can be used.

Fluorescent Part 30

The fluorescent part 30 has a light-receiving surface to which the laser light reflected at the light-reflecting surface 21 is irradiated, and is configured to emit fluorescent light upon the light-receiving surface being irradiated with the reflected laser light. In FIG. 3, the lower surface of the fluorescent part 30 is the light-receiving surface and the upper surface of the fluorescent part 30 is the light emitting surface. As shown in FIG. 3, the fluorescent part 30 is disposed above the light-transmissive part 82 of the cover 80.

The fluorescent part 30 contains a fluorescent material. Examples of the fluorescent material include a YAG fluorescent material, an LAG fluorescent material, and an $\alpha$-sialon fluorescent material. Among those, a YAG phosphor that has good heat-resisting properties is preferable. The fluorescent part 30 is preferably made of an inorganic material that has higher resistance to heat and/or light compared to an organic material, and thus reliability can be improved. Accordingly, higher resistance to heat and/or light can be obtained compared to the cases in which the fluorescent part includes an organic material; thus, reliability can be improved. For the fluorescent part 30 made of an inorganic material, phosphor ceramics or a single crystal of a fluorescent material can be used. For the phosphor ceramics, a sintered body of phosphor particles and an additive can be used. When phosphor ceramics of YAG phosphor is used, aluminum oxide can be used for the additive.

As shown in FIG. 2 and FIG. 3, the light-receiving surface of the fluorescent part 30 preferably has a shape that is elongated in one direction. For example, an elliptic shape or a rectangular shape can be employed. In view of mass productivity for the fluorescent part 30, a rectangular shape is preferably employed. When the light-receiving surface of such a shape is to be employed, the fluorescent part 30 and the semiconductor laser element 10 are preferably disposed such that the longitudinal direction of the fluorescent part 30 and the longitudinal direction of FFP of the laser light are in parallel to each other the laser, in order to irradiate the light-receiving surface of the fluorescent part 30 with the laser light having a shape elongated in one direction, reflected at the light-reflecting surface 21. This arrangement allows for a reduction of the distance between the region of the fluorescent part 30 irradiated with the laser light and an outer peripheral edge of the fluorescent part 30, thus facilitating dissipation of heat generated from the fluorescent part 30. Accordingly, degradation of the wavelength conversion efficiency of the fluorescent part 30 can be reduced.

First Light-Shielding Part 90

The first light-shielding part 90 is to reduce emission of light from the regions other than the upper surface of the fluorescent part 30, and as shown in FIG. 3, disposed surrounding the lateral surfaces of the fluorescent part 30. The first light-shielding part 90 is disposed directly in contact with the fluorescent part 30. When the fluorescent part 30 includes a YAG phosphor, ceramics that contains aluminum oxide as its main component is preferably used for the first light-shielding part 90. With this arrangement, light from the fluorescent part 30 can be shielded while enhancing the bonding between the fluorescent part 30 and the first light-shielding part 90.

Aluminum oxide used for the first light-shielding part 90 is the same material as the sapphire that can be used for the heat dissipating member 100 to be described later below, but a region in the first light-shielding part 90 closer to the fluorescent part 30 has a lower sintered density, and thus contains voids. Even the same material is used, light from the fluorescent part 30 is reflected at the interfaces between the particles of aluminum oxide or the like and voids, and thus light is not easily transmitted through the first light-shielding part 90.

Heat Dissipating Member 100

As shown in FIG. 3, the fluorescent part 30 and the first light-shielding part 90 are fixed to the cover 80 with the heat dissipating member 100 interposed therebetween. The upper surface of the heat dissipating member 100 is preferably directly in contact with the lower surfaces of the light-receiving surface of the fluorescent part 30 and the first light-shielding part 90. With this arrangement, the region of the fluorescent part 30 irradiated with the laser light and thus produce heat are in direct contact with each other, which can facilitate dissipation of heat produced from the fluorescent part 30. For the heat dissipating member 100, a light-transmissive member can be used and for example, sapphire, quartz, or silicon carbide can be used. Alternatively, the fluorescent part 30 may be arranged above the light-reflecting surface by fixing the first light-shielding part 90 and the heat dissipating member 100 with the use of a heat resistant metal material or the like.

Second Light-Shielding Part 110

A second light-shielding part 110 is disposed on the lateral surfaces of the heat dissipating member 100. Accordingly, the amount of light passing through the lateral sides of the heat dissipating member 100 can be reduced. The second light-shielding part 100 can be formed with a resin material containing light scattering particles of, for example, titanium oxide.

Second Embodiment

Figure 18:
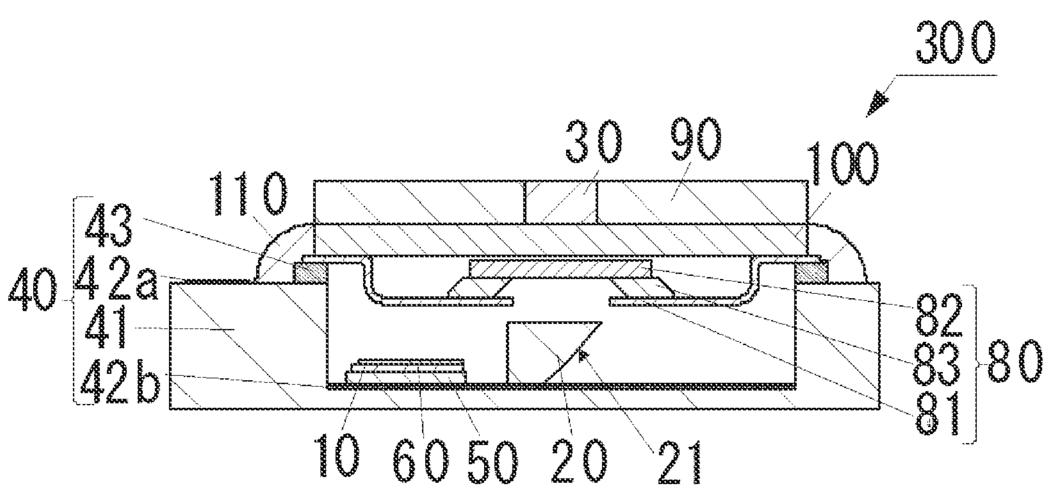
FIG. 18 is a cross-sectional view illustrating a light emitting element according to a second embodiment.

In FIG. 18 a schematic cross-sectional view of the light emitting device 300 according to a second embodiment is shown. The semiconductor light emitting element 300 has a substantially similar configuration as that of the light emitting device 200 described in the first embodiment, except for the aspects described below.

In the light emitting device 300, the light-reflecting surface of the optical element 20 is arranged at a side located away from the LD element 10. That is, the laser light is made incident into the optical element 20 through a lateral surface of the optical element 20 located close to the LD element 10, and is reflected at the light-reflecting surface 21, and emitted from the upper surface of the optical element 20. Even in such cases, the light intensity distribution of the laser light in the light-receiving surface approaching uniformity can be obtained. The optical element 20 can include, a main component, quartz or glass such as BK7, and has a light-reflecting surface made of a material having high reflectance such as a metal.

Third Embodiment

Figure 19:
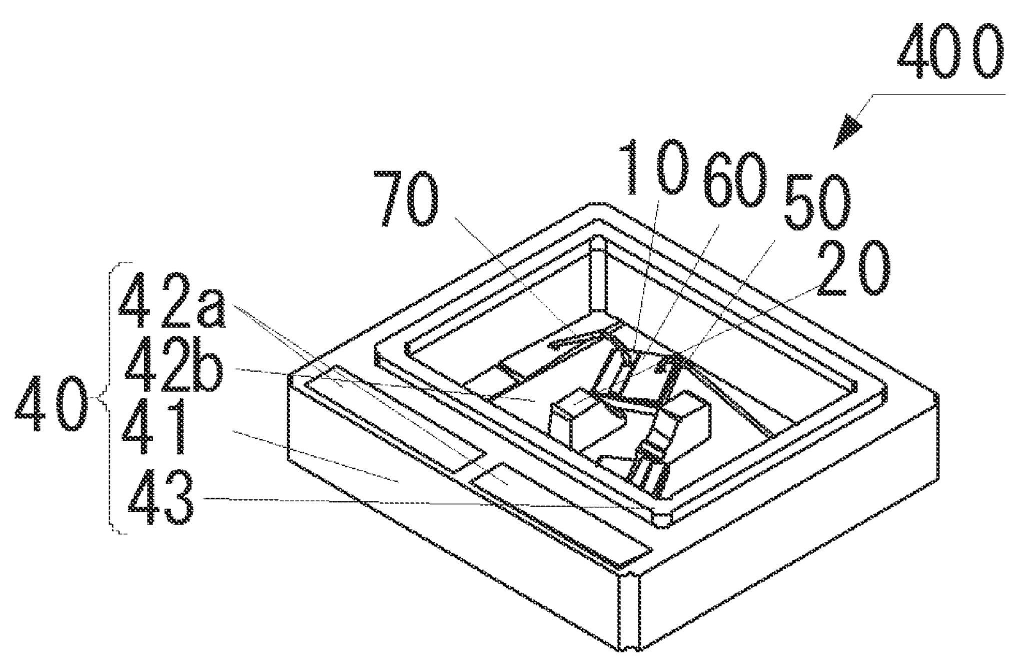
FIG. 19 is a schematic perspective view illustrating a configuration in a recess defined in a base member of the light emitting device according to a third embodiment.
Figure 20:
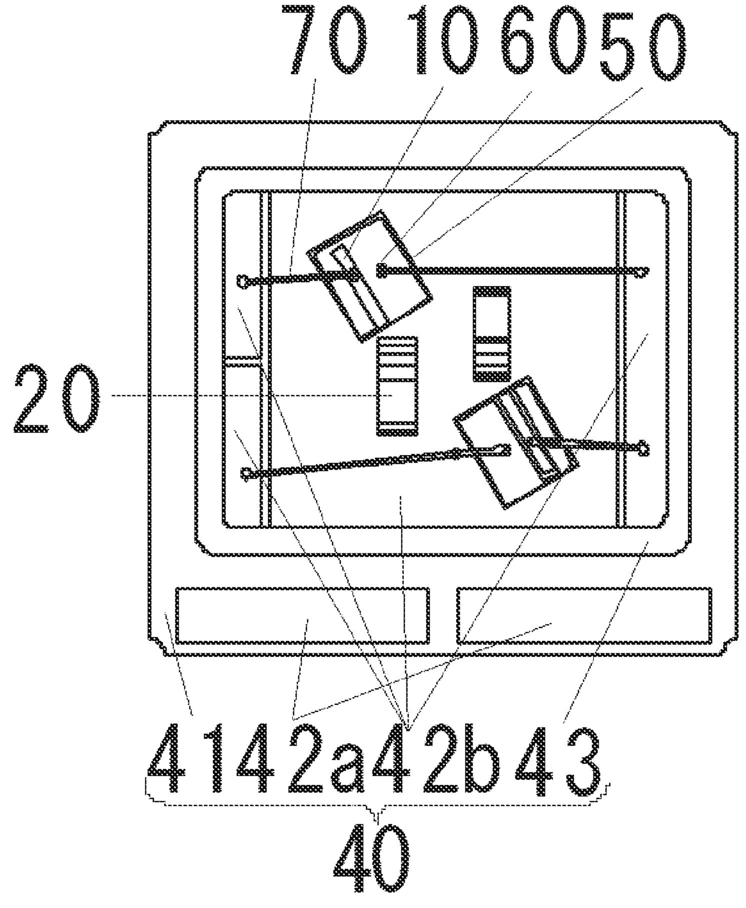
FIG. 20 is a schematic top view illustrating a configuration in a recess defined in a base member of the light emitting device according to the third embodiment.

FIG. 19 is a schematic perspective view illustrating a configuration in a recess formed in a base member 40 of the light emitting device 400 according to a third embodiment. The semiconductor light emitting element 400 has a substantially same configuration as that of the light emitting device 200 described in the first embodiment, except for those aspects described below.

The light emitting device 400 includes two LD elements 10 and two optical elements 20. The optical elements 20 are arranged such that the laser light emitted from each of the LD elements 10 is reflected at a light-reflecting surface 21 of corresponding one of the optical elements 10, and is irradiated on the light-receiving surface of a single fluorescent part 30. More specifically, the two LD elements 10 are disposed such that the light emitting surface of the LD elements are in parallel to each other, and the two optical elements 20 are disposed such that lateral surfaces of the two optical elements 20 facing each other are in parallel to each other. Further, a plane in parallel to any one of the lateral surfaces of the optical elements 20 and a plane in parallel to the light emitting surface of the corresponding LD elements 10 are at an angle other than perpendicular.

Figure 21:
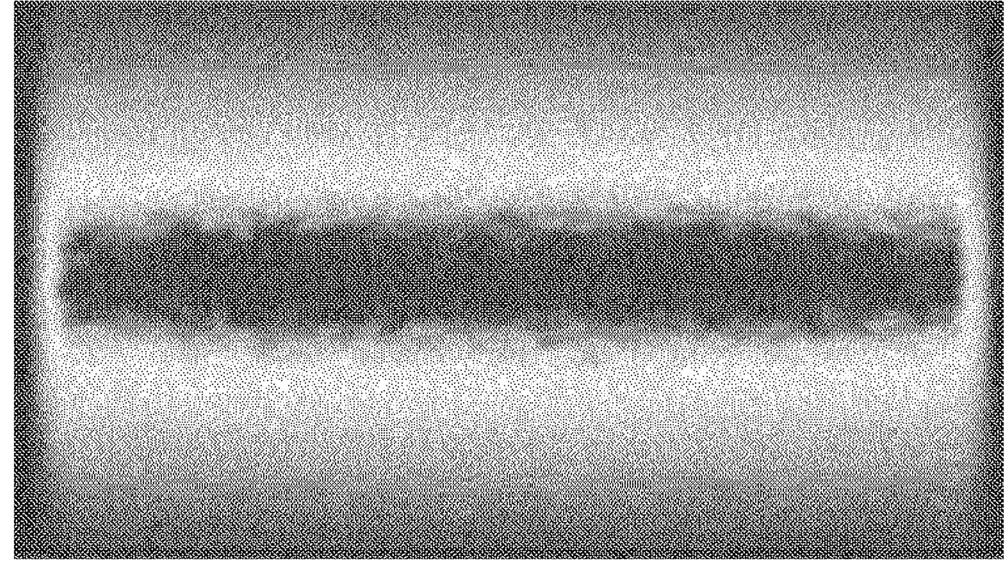
FIG. 21 is a diagram showing a simulation result of light intensity distribution at a first region of light-receiving surface of a fluorescent part in the light emitting device according to the third embodiment.

FIG. 21 is a diagram showing a simulation result of light intensity distribution at the light-receiving surface of the fluorescent part 30 in the light emitting device 400. As shown in FIG. 21, with the use of a plurality of LD elements 10, the optical intensity of laser light irradiated on the light-receiving surface of the fluorescent part 30 can be enhanced.

Also in the present embodiment, two opposite lateral surfaces defining the recess of the base member may be formed into light-reflecting surfaces, such that light from the LD elements are irradiated on the light-reflecting surfaces respectively. Also, the optical element used in the second embodiment can be used as each of the two optical elements.

Fourth Embodiment

Figure 22:
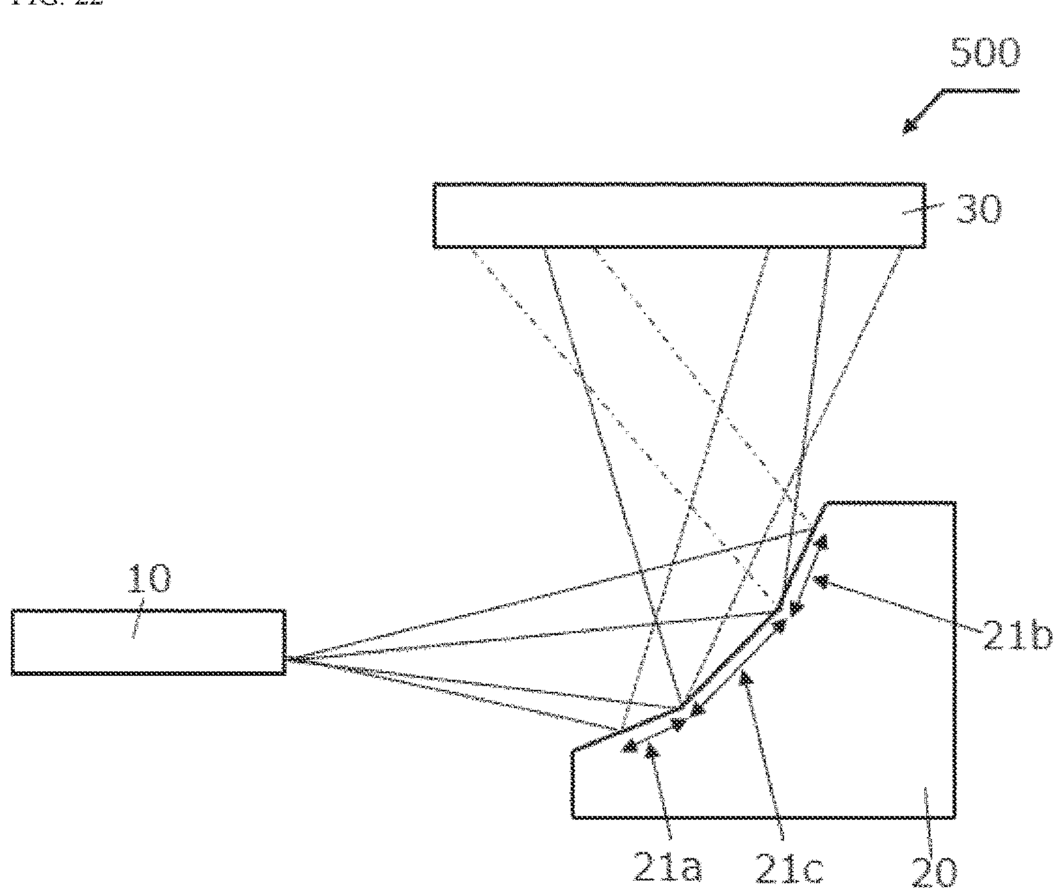
FIG. 22 is a diagram illustrating propagation of light emitted from a semiconductor laser element, reflected at a light-reflecting surface, and irradiated on a light-receiving surface of a fluorescent part, in the light emitting device according to the fourth embodiment.

FIG. 22 is a diagram illustrating propagation of light emitted from a semiconductor laser element 10, reflected at a light-reflecting surface 21, and irradiated on a light-receiving surface of a fluorescent part 30, in the light emitting device 500 according to a fourth embodiment. The semiconductor light emitting element 500 has a substantially similar configuration as that of the light emitting device 200 described in the first embodiment, except for those described below.

As shown in FIG. 22, in the light emitting device 500, a region of the light-reflecting surface 21 to be irradiated with the laser light includes a first region 21*a* corresponding to a first end and a second region 21*b* corresponding to a second end that is opposite side of the first end of three portions of the elliptic shape of FFP that is divided in its longitudinal direction. The first region 21*a* is arranged such that the laser light reflected at the first region 21*a* and a portion of the laser light reflected at the third region 21*c* at a location closer to the first region 21*a* or to the second region 21*b* are overlapped with each other on the light-receiving surface of the fluorescent part 30. The second region 21*b* is arranged such that the laser light reflected at the second region 21*b* and a portion of the laser light reflected at the third region 21*c* at a location closer to the other of the first region 21*a* or the second region 21*b* are overlapped with each other on the light-receiving surface of the fluorescent part 30. That is, the first region 21*a* and the second region 21*b* are provided such that a portion of the laser light reflected at the first region 21*a* and a portion of the laser light reflected at the second region 21*b* are respectively overlapped with portions of the laser light reflected at the third region 21*c* on the light-receiving surface of the fluorescent part 30 at regions where the laser light reflected from the third region 21*c* has a lower light intensity.

As shown in FIG. 22, in the light emitting device 500, the first region 21*a* is arranged such that the laser light reflected at the first region 21*a* and a portion of the laser light reflected at the third region 21*c* at a location closer to the second region 21*b* are overlapped with each other on the light-receiving surface of the fluorescent part 30. The second region 21*b* is arranged such that the laser light reflected at the second region 21*b* and a portion of the laser light reflected at the third region 21*c* at a location closer to the first region 21*a* are overlapped with each other on the light-receiving surface of the fluorescent part 30. That is, the first region 21_a_ and the second region 21_b_ are arranged such that the light reflected at the first region 21_a_ and the light reflected at the second region 21_b_ cross each other before irradiated on the light-receiving surface of the fluorescent part 30. With this arrangement, a portion with lower light emission intensity in the laser light reflected at the first region 21_a_ (in FIG. 22, laser light reflected near the left end of the first region 21_a_) and a portion with lower light emission intensity in the laser light reflected at the third region 21_c_ (in FIG. 22, laser light reflected near the right end of the third region 21_c_) can be overlapped with each other, and a portion with lower light emission intensity in the laser light reflected at the second region 21_b_ (in FIG. 22, laser light reflected near the right end of the second region 21_b_) and a portion with lower light emission intensity in the laser light reflected at the third region 21_c_ (in FIG. 22, laser light reflected near the left end of the third region 21_c_) can be overlapped with each other. Accordingly, the light intensity of the laser light at the light-receiving surface of the fluorescent part 30 can be made close to uniform.

The light emitting device 500 may also be configured such that the laser light reflected at the first region and the laser light reflected at the second region are not cross each other. In other words, the light-reflecting surface may be arranged such that a portion of the laser light reflected at the third region at a location closer to the first region and a portion of the laser light reflected at the first region at a location closer to the third region are overlapped with each other, while a portion of the laser light reflected at the third region at a location closer to the second region and a portion of the laser light reflected at the second region at a location closer to the third region are overlapped with each other. Even in such cases, a portion of the laser light reflected at the third region and having lower light emission intensity can be overlapped with the laser light reflected at the first region and the laser light reflected at the second region, and thus a certain degree of effect can be obtained.

Fifth Embodiment

Figure 23:
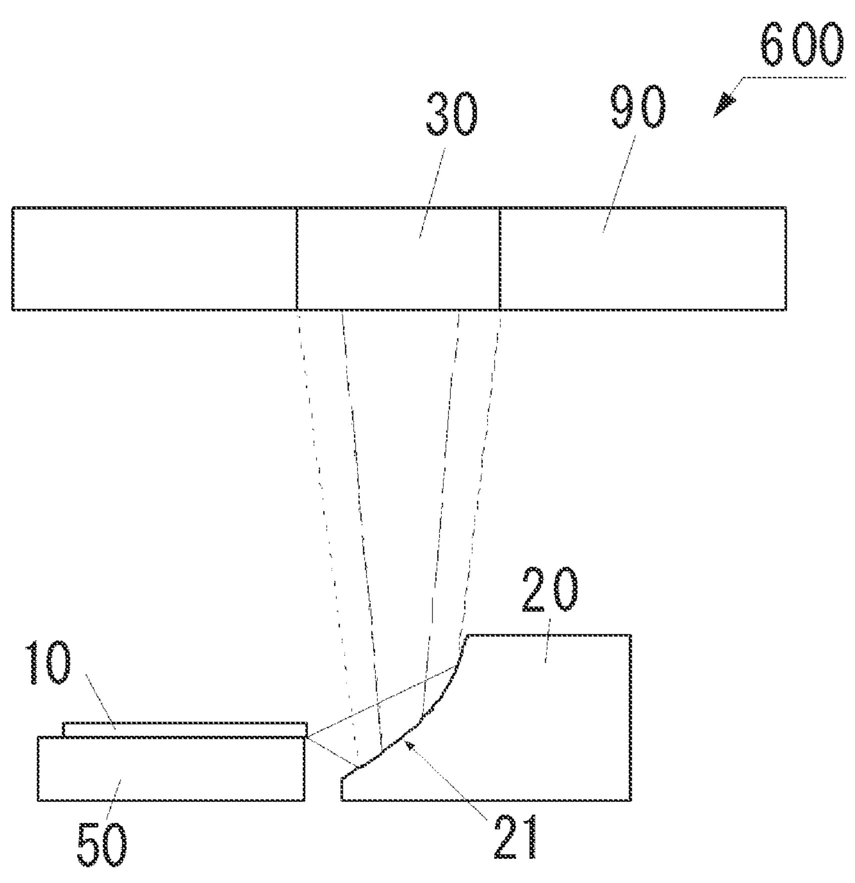
FIG. 23 is a diagram illustrating propagation of light emitted from a semiconductor laser element, reflected at a light-reflecting surface, and irradiated on a light-receiving surface of a fluorescent part, in the light emitting device according to a fifth embodiment.

FIG. 23 is a diagram illustrating propagation of light emitted from a semiconductor laser element 10, reflected at a light-reflecting surface 21, and irradiated on a light-receiving surface of a fluorescent part 30, in the light emitting device 600 according to a fifth embodiment. The semiconductor light emitting element 600 has a substantially similar configuration as that of the light emitting device 200 described in the first embodiment, except for those described below.

The light emitting device 600 includes an optical element 20 having a light-reflecting surface 21 of a curved surface. The light-reflecting surface 21 of a curved surface is formed such that a divergent angle of the laser light reflected at the regions corresponding to both longitudinal ends of the FFP of an elliptic shape is smaller than a divergent angle of the laser light reflected at the regions corresponding to a center portion of the FFP, to obtain the light intensity distribution of the laser light at the light-receiving surface of the fluorescent part 30 approaching uniformity. That is, the light-reflecting surface 21 is disposed such that, in the longitudinal direction of the FFP of an elliptic shape, light in the vicinity of the center spreads outward, while reducing spreading of light in the vicinity of the both ends. Even in such cases, the light intensity distribution of the laser light at the light-receiving surface can be made close to uniform.

Other embodiments are described below.

A light emitting device includes one or more semiconductor laser elements, each configured to emit a laser light, one or more light-reflecting parts, each having a light-reflecting surface configured to reflect the laser light emitted from corresponding one of the one or more semiconductor laser elements, and a fluorescent part having a light-receiving surface configured to be irradiated with the laser light reflected at the light-reflecting surface of each of the one or more light-reflecting parts. An irradiated region is formed on the light-reflecting surface when the light-reflecting surface is irradiated with the laser light, and the irradiated region includes a first end and a second end opposite to the first end, located at two opposite ends of the irradiated region in a longitudinal direction. The light-reflecting surface of each of the one or more light-reflecting parts is arranged such that a portion of the laser light reflected at at least a first end of the irradiated region and a portion of the laser light reflected at a location other than the first end of the irradiated region are overlapped with each other on the light-receiving surface.

In the light emitting device, the light-reflecting surface of each of the one or more light-reflecting parts includes a plurality of regions positioned at different angles with respect to a lower surface of the light-reflecting part. The laser light from corresponding one of the one or more semiconductor laser elements is irradiated on the plurality of regions. An irradiated region is formed on the light-receiving surface when the laser light reflected at each of the one or more light-reflecting parts are irradiated on the light-receiving surface, the irradiated region on the light-receiving surface includes a first end. A portion of the laser light reflected at a location other than the first end of the irradiated region on the light-reflecting surface of each of the one or more light-reflecting parts is irradiated on at least the first end of the irradiated region on the light-receiving surface.

In the light emitting device, the one or more semiconductor laser elements are each configured to emit a laser light with a light intensity distribution higher at a center portion than at a peripheral portion of the irradiated region on the light-reflecting surface. The irradiated region on the light-reflecting surface of each of the one or more light-reflecting parts comprises a first region including the first end and configured to reflect a portion of the laser light irradiated at least to the first end, and a second region including a second end located at an opposite side of the first end in the irradiated region, the second region is configured to reflect a portion of the laser light irradiated to the second end. A portion of the laser light reflected at locations closer to the center portion of the first region is irradiated to the light-receiving surface at locations closer to a first end of an irradiated region on the light-receiving surface. The closer the location of a portion of the laser light reflected at locations to the center portion of the second region, the closer the location of the reflected laser light irradiated to a second end located at an opposite side of the first end of the irradiated region on the light-receiving surface.

The light emitting devices described in the embodiments can be applied for lightings, lighting for vehicles, or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:

a semiconductor laser element configured to emit light in a first direction;

a light-reflecting part having a light-reflecting surface; and a base member comprising:

a bottom part, a wall part surrounding the bottom part and having an upper surface, a recess defined by an upper surface of the bottom part and an inner lateral surface of the wall part, the recess being located inward of the upper surface of the wall part in a top view, a first wiring part comprising a first wiring region and a second wiring region provided on the upper surface of the wall part, and a second wiring part comprising a first wiring region and a second wiring region that are located in the recess, wherein:

the light-reflecting part is located at a position spaced from the inner lateral surface of the wall part that defines the recess, in the top view, the wall part includes a first outer edge toward which the semiconductor laser element is configured to emit light, a second outer edge opposite the first outer edge, a third outer edge extending from the first outer edge to the second outer edge, and a fourth outer edge opposite the third outer edge, in the top view, the recess includes a first outer edge extending along the first outer edge of the wall part, a second outer edge opposite the first outer edge, a third outer edge extending along the third outer edge of the wall part, and a fourth outer edge opposite the third outer edge, the semiconductor laser element and the light-reflecting part are located in the recess, the light reflecting part being located between the semiconductor laser element and the first outer edge of the recess, the first wiring region and the second wiring region of the first wiring part are located between the second outer edge of the wall part and the second outer edge of the recess, a distance between the second outer edge of the wall part and the second outer edge of the recess is greater than a distance between the first outer edge of the wall part and the first outer edge of the recess and greater than a distance between the third outer edge of the wall part and the third outer edge of the recess, and the first wiring region and the second wiring region of the first wiring part are arranged adjacent to each other in a second direction perpendicular to the first direction on the upper surface of the wall part.

2. The light emitting device according to claim 1 further comprising:

a cover, wherein the base member comprises a welding part surrounding the recess, wherein the cover is bonded to the welding part, wherein the cover is not overlapped with the first wiring region and the second wiring region of the first wiring part in a top view, wherein light reflected by the light-reflecting part is transmitted through the cover and emitted upward.

3. The light emitting device according to claim 2, wherein the welding part is formed of a material that contains iron.

4. The light emitting device according to claim 1, wherein an outer edge of the first wiring region of the first wiring part on a side corresponding to the third outer edge of the wall part is spaced from the third outer edge of the wall part, wherein an outer edge of the second wiring region of the first wiring part on a side corresponding to the fourth outer edge of the wall part is spaced from the fourth outer edge of the wall part, and wherein (i) a distance in the second direction between said outer edge of the first wiring region of the first wiring part and said outer edge of the second wiring region of the first wiring part is greater than (ii) a distance in the second direction from the third outer edge of the recess to the fourth outer edge of the recess.

5. The light emitting device according to claim 1, wherein the semiconductor laser element is disposed on the bottom part.

6. The light emitting device according to claim 5, wherein the base member comprises a ceramic of aluminum nitride.

7. The light emitting device according to claim 1, wherein the base member comprises a ceramic of aluminum nitride.

8. The light emitting device according to claim 1, wherein the base member comprises a ceramic of aluminum oxide.

9. The light emitting device according to claim 1 further comprising:

a sub-mount, wherein the semiconductor laser element is mounted on the bottom part of the base member via the sub-mount.

10. The light emitting device according to claim 1 further comprising:

a wire connected to the semiconductor laser element, wherein the semiconductor laser element is electrically connected to the second wiring region of the second wiring part via the wire.

11. The light emitting device according to claim 10, wherein, in the top view, the wire and the light-reflecting surface do not overlap each other.

12. The light emitting device according to claim 1, wherein the base member and the light-reflecting part are provided separately.

13. The light emitting device according to claim 1, wherein the semiconductor laser element and the light-reflecting part are disposed on a same plane.

14. The light emitting device according to claim 1, wherein a width in the first direction of each of the first wiring region and the second wiring region of the first wiring part is smaller than a width in the second direction of each of the first wiring region and the second wiring region of the first wiring part.

15. The light emitting device according to claim 1, wherein the upper surface of the wall part is positioned above the semiconductor laser element and the light-reflecting part.

16. The light emitting device according to claim 1, further comprising:

a fluorescent part having a light-receiving surface configured to be irradiated with the light reflected at the light-reflecting surface;

wherein an irradiated region is formed on the light-reflecting surface when the light-reflecting surface is irradiated with the light, the irradiated region including a first endmost portion and a second endmost portion opposite the first endmost portion; and wherein the light-reflecting surface is arranged such that the following occur simultaneously when the light-reflecting surface is irradiated with the light:

(i) a portion of the light reflected at the first endmost portion of the irradiated region and a portion of the light reflected at a location other than the first endmost portion of the irradiated region are overlapped with each other on the light-receiving surface, (ii) a portion of the light reflected at the second endmost portion of the irradiated region and a portion of the light reflected at a location other than the second endmost portion of the irradiated region are overlapped with each other on the light-receiving surface, and (iii) a portion of the light reflected at the first endmost portion of the irradiated region and a portion of the light reflected at the second endmost portion of the irradiated region are not overlapped with each other on the light-receiving surface.

17. The light emitting device according to claim 1, wherein the first wiring region and the second wiring region of the second wiring part are arranged in the second direction.

18. The light emitting device according to claim 1, wherein in the top view, no wiring region is provided between the first outer edge of the wall part and the first outer edge of the recess.

19. The light emitting device according to claim 1, wherein the semiconductor laser element has a light emitting surface perpendicular to a lower surface of the base member.

20. The light emitting device according to claim 19, wherein the semiconductor laser element is configured to emit light from the light emitting surface laterally toward the light-reflecting part.

* * * * *